United States Patent
Kagawa

(10) Patent No.: US 9,326,433 B2
(45) Date of Patent: Apr. 26, 2016

(54) COMPOSITE ELECTROMAGNETIC-WAVE-ABSORBING FILM

(76) Inventor: Seiji Kagawa, Koshigaya (JP)

(*) Notice: Subject to any disclaimer, the term of this patent is extended or adjusted under 35 U.S.C. 154(b) by 977 days.

(21) Appl. No.: 13/142,457

(22) PCT Filed: Oct. 29, 2010

(86) PCT No.: PCT/JP2010/069306
§ 371 (c)(1),
(2), (4) Date: Jun. 28, 2011

(87) PCT Pub. No.: WO2011/077834
PCT Pub. Date: Jun. 30, 2011

(65) Prior Publication Data
US 2011/0268925 A1 Nov. 3, 2011

(30) Foreign Application Priority Data

Dec. 25, 2009 (JP) .................. 2009-296298

(51) Int. Cl.
*B32B 3/30* (2006.01)
*H05K 9/00* (2006.01)

(52) U.S. Cl.
CPC ............ *H05K 9/0088* (2013.01); *H05K 9/0086* (2013.01); *Y10T 428/2457* (2015.01)

(58) Field of Classification Search
USPC ........................................................ 428/167
See application file for complete search history.

(56) References Cited

U.S. PATENT DOCUMENTS

| 4,554,908 | A | * | 11/1985 | Hanlet et al. | 126/652 |
|---|---|---|---|---|---|
| 5,373,296 | A | * | 12/1994 | Ishino et al. | 342/4 |
| 6,337,661 | B1 | | 1/2002 | Kondoh et al. | |
| 7,749,620 | B2 | | 7/2010 | Yoshida et al. | |
| 2002/0195916 | A1 | * | 12/2002 | Marutsuka | 313/112 |
| 2005/0233102 | A1 | | 10/2005 | Kagawa et al. | |
| 2006/0115636 | A1 | | 6/2006 | Yoshida et al. | |

(Continued)

FOREIGN PATENT DOCUMENTS

| CN | 1668783 A | | 9/2005 |
|---|---|---|---|
| EP | 2065916 A2 | * | 6/2009 |
| JP | 7-283578 A | | 10/1995 |

(Continued)

OTHER PUBLICATIONS

Machine_English_Translation_JP_2009176827_A; Kagawa, Seiji; Electromagnetic Wave Absorbing Film and Forming Method Thereof; Aug. 6, 2009; JPO; whole document.*

(Continued)

*Primary Examiner* — Tahseen N Khan
(74) *Attorney, Agent, or Firm* — Birch, Stewart, Kolasch & Birch, LLP

(57) ABSTRACT

A composite electromagnetic-wave-absorbing film comprising pluralities of adjacent electromagnetic-wave-absorbing film pieces arranged on a plastic base film, each electromagnetic-wave-absorbing film piece being a plastic film provided with a conductor layer having a large number of substantially parallel, intermittent, linear scratches formed with irregular widths and intervals in plural directions, and pluralities of the electromagnetic-wave-absorbing film pieces being different in at least one of the widths, intervals, lengths and directions of the linear scratches.

15 Claims, 22 Drawing Sheets

(56) References Cited

U.S. PATENT DOCUMENTS

| | | | |
|---|---|---|---|
| 2011/0008580 A1* | 1/2011 | Kagawa et al. | 428/167 |
| 2011/0031008 A1* | 2/2011 | Kagawa | 174/377 |

FOREIGN PATENT DOCUMENTS

| | | | |
|---|---|---|---|
| JP | 9-148782 A | | 6/1997 |
| JP | 2000-307305 A | | 11/2000 |
| JP | 2004-134528 A | | 4/2004 |
| JP | 2005-311330 A | | 11/2005 |
| JP | 2009176827 A | * | 8/2009 |
| WO | WO 03/091003 A1 | | 11/2003 |
| WO | WO 2008/075746 A | | 6/2008 |
| WO | WO 2009157544 A1 | * | 12/2009 |
| WO | WO 2010093027 A1 | * | 8/2010 |
| WO | WO 2010099132 A2 | * | 9/2010 |

OTHER PUBLICATIONS

International Search Report, dated Nov. 30, 2010, issued in PCT/JP2010/069306.

Chinese Office Action dated Mar. 31, 2014 with its English translation for Chinese Application No. 201080018242.3.

* cited by examiner

COMPOSITE ELECTROMAGNETIC-WAVE-ABSORBING FILM

FIELD OF THE INVENTION

The present invention relates to a composite electromagnetic-wave-absorbing film having excellent electromagnetic wave absorbability with reduced anisotropy.

BACKGROUND OF THE INVENTION

Shield sheets for preventing the leak and intrusion of electromagnetic waves are used in electronic and communications apparatuses and systems such as personal computers, cell phones, electronic toll-collecting (ETC) systems on toll roads, wireless LAN, etc. The shield sheets are required to efficiently absorb electromagnetic waves in a wide frequency range, with little absorbability difference (anisotropy) depending on incident directions. Particularly, in systems using circularly polarized electromagnetic waves such as ETC, etc., shield sheets are required to efficiently absorb both of TE waves (electromagnetic waves whose electric field components are perpendicular to an incident surface) and TM waves (electromagnetic waves whose magnetic field components are perpendicular to an incident surface).

Metal sheets or nets now widely used as shield sheets are heavy, and need much time to be arranged in apparatus casings. In addition, metal sheets or nets have large anisotropy in electromagnetic wave absorbability, resulting in drastic decrease in electromagnetic wave absorbability as the incident angles of electromagnetic waves increase.

As a light-weight, electromagnetic-wave-absorbing shield sheet easy to be arranged in a casing, JP 9-148782 A proposes a shield sheet comprising a plastic film, and first and second vapor-deposited aluminum layers formed on both surfaces thereof, the first vapor-deposited aluminum layer being etched to a non-conductive linear pattern, and the second vapor-deposited aluminum layer being etched to a conductive network pattern. However, because this shield sheet has a periodic linear pattern and a periodic network pattern, it cannot efficiently absorb electromagnetic waves in a wide frequency range, and its electromagnetic wave absorbability has large anisotropy.

JP 2004-134528 A proposes an electromagnetic wave absorber comprising an anisotropic resistance layer, a dielectric layer containing conductive fillers, and an electromagnetic-wave-reflecting layer in this order, the anisotropic resistance layer comprising conductive line patterns, and having anisotropy with surface resistance of 1 kΩ or less in one direction and 10 kΩ or more in other directions. JP 2004-134528 A describes that the arrangement of the electromagnetic wave absorber with the line patterns in parallel to the magnetic field components of TE waves can absorb both TE waves and TM waves efficiently. However, this electromagnetic wave absorber suffers large anisotropy in electromagnetic wave absorbability.

OBJECT OF THE INVENTION

Accordingly, an object of the present invention is to provide a composite electromagnetic-wave-absorbing film having not only good absorbability to electromagnetic waves in various frequencies, but also low anisotropy of electromagnetic wave absorbability.

DISCLOSURE OF THE INVENTION

As a result of intensive research in view of the above object, the inventor has found that the adjacent arrangement of pluralities of electromagnetic-wave-absorbing film pieces each having a conductor layer having a large number of substantially parallel, intermittent, linear scratches formed with irregular widths and intervals in plural directions provides a composite electromagnetic-wave-absorbing film with good absorbability to electromagnetic waves having various frequencies with reduced anisotropy. The present invention has been completed based on such finding.

Thus, the composite electromagnetic-wave-absorbing film of the present invention comprises pluralities of adjacent electromagnetic-wave-absorbing film pieces arranged on a plastic base film, each electromagnetic-wave-absorbing film piece being a plastic film provided with a conductor layer having a large number of substantially parallel, intermittent, linear scratches formed with irregular widths and intervals in plural directions, and pluralities of the electromagnetic-wave-absorbing film pieces being different in at least one of the widths, intervals, lengths and directions of the linear scratches.

There are preferably small gaps between adjacent electromagnetic-wave-absorbing film pieces. The gaps are preferably as wide as 0.1-5 mm.

The conductor layers of pluralities of electromagnetic-wave-absorbing film pieces preferably comprise a first conductor layer having surface resistance of 20 Ω/square to 1 kΩ/square, a second conductor layer having surface resistance of more than 1 kΩ/square and less than 3.5 kΩ/square, and a third conductor layer having surface resistance of 3.5 kΩ/square to 1 MΩ/square. The area ratios of the first to third conductor layers are preferably 50-70%, 10-20% and 20-30%, respectively, based on their total area (100%).

Any of the electromagnetic-wave-absorbing film pieces are preferably rectangular, each of the electromagnetic-wave-absorbing film piece having the second conductor layer and the electromagnetic-wave-absorbing film piece having the third conductor layer being adjacent to one side of the electromagnetic-wave-absorbing film piece having the first conductor layer.

Each conductor layer is preferably a single-layer or multi-layer, thin metal film.

The linear scratches preferably have widths in a range of 0.1-100 μm for 90% or more and 1-50 μm on average, and intervals in a range of 0.1-200 μm and 1-100 μm on average.

Linear scratches in each electromagnetic-wave-absorbing film piece are preferably oriented in two directions, with crossing angles of 30-90°.

DESCRIPTION OF THE BEST MODE OF THE INVENTION

The embodiments of the present invention will be explained referring to the attached drawings, and it should be noted that explanation concerning one embodiment is applicable to other embodiments unless otherwise mentioned. Also, the following explanation is not restrictive, and various modifications may be made within the scope of the present invention.

[1] Composite Electromagnetic-Wave-Absorbing Film

Figure 1A:
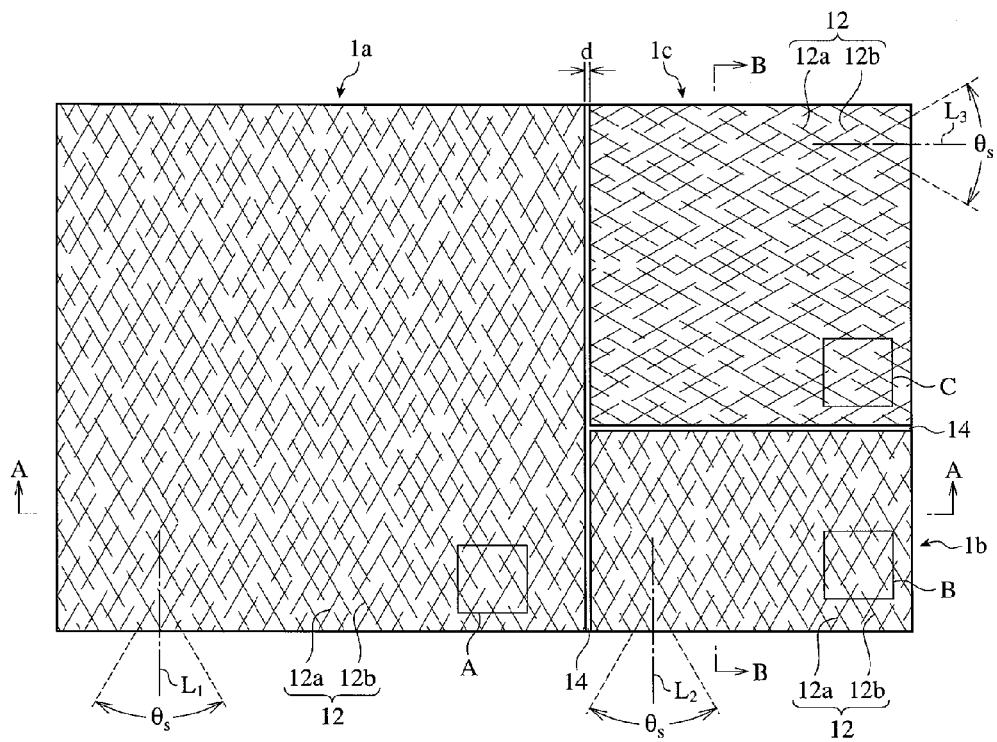
FIG. 1(a) is a plan view showing a composite electromagnetic-wave-absorbing film according to one embodiment of the present invention.
Figure 1B:
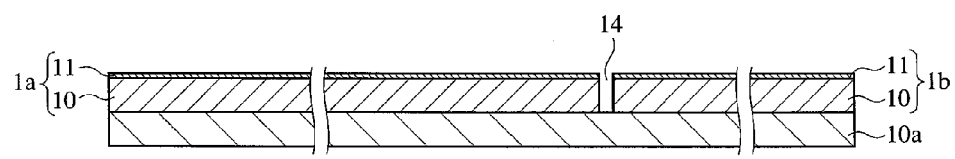
FIG. 1(b) is a cross-sectional view taken along the line A-A in FIG. 1(a).
Figure 1C:
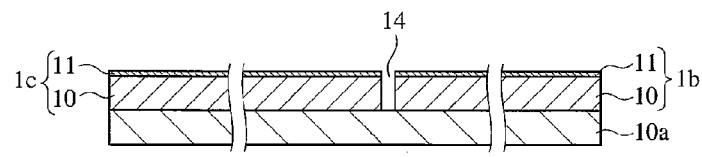
FIG. 1(c) is a cross-sectional view taken along the line B-B in FIG. 1(a).

FIGS. 1(a)-1(c) show one example of composite electromagnetic-wave-absorbing films having three electromagnetic-wave-absorbing film pieces 1a-1c adjacently arranged on a surface of a plastic base film 10a. Each of the electromagnetic-wave-absorbing film pieces 1a-1c comprises a plastic film 10, and a thin metal film 11 formed on a surface of the plastic film 10, the entire surface of the thin metal film 11 having a large number of substantially parallel, intermittent, linear scratches 12 formed with irregular widths and intervals in plural directions. For explanation, the lengths, widths and intervals of the linear scratches 12 are exaggerated in FIG. 1(a).

(1) Electromagnetic-Wave-Absorbing Film Piece

Any of the first to third electromagnetic-wave-absorbing film pieces 1a-1c has a single-layer or multi-layer, thin metal film 11 on at least one surface of the plastic film 10. The multi-layer, thin metal film is preferably a two-layer, thin metal film. In this case, a combination of a thin, magnetic metal film and a thin, non-magnetic metal film is preferable.

(a) Plastic Film

Resins forming the plastic film 10 are not particularly restrictive as long as they have sufficient strength, flexibility and workability in addition to insulation, and they may be, for instance, polyesters (polyethylene terephthalate, etc.), polyarylene sulfide (polyphenylene sulfide, etc.), polyamides, polyimides, polyamideimides, polyether sulfone, polyetheretherketone, polycarbonates, acrylic resins, polystyrenes, polyolefins (polyethylene, polypropylene, etc.), etc. The thickness of the plastic film 10 may be about 10-100 µm.

(b) Thin Metal Film

Metals forming the thin metal film 11 are not particularly restrictive as long as they have conductivity, and they are preferably aluminum, copper, nickel, cobalt, silver and their alloys, particularly aluminum, copper, nickel and their alloys from the aspect of corrosion resistance and cost. The thickness of the thin metal film is preferably 0.01 µm or more. Though not restrictive, the upper limit of the thickness may be practically about 10 µm. Of course, the thin metal film may be thicker than 10 µm, with substantially no change in the absorbability of high-frequency electromagnetic waves. The thickness of the thin metal film is more preferably 0.01-5 µm, most preferably 0.01-1 µm, particularly 10-100 nm.

Figure 2A:
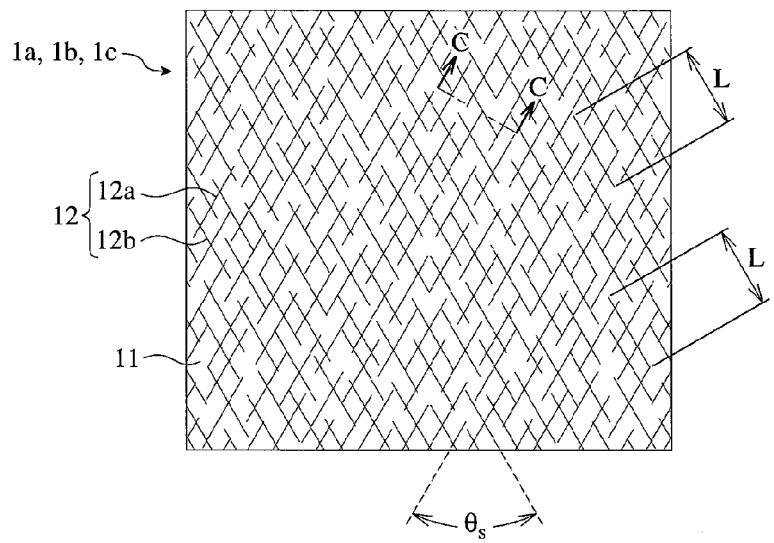
FIG. 2(a) is a plan view showing portions A, B and C in the composite electromagnetic-wave-absorbing film of FIG. 1(a).
Figure 2B:
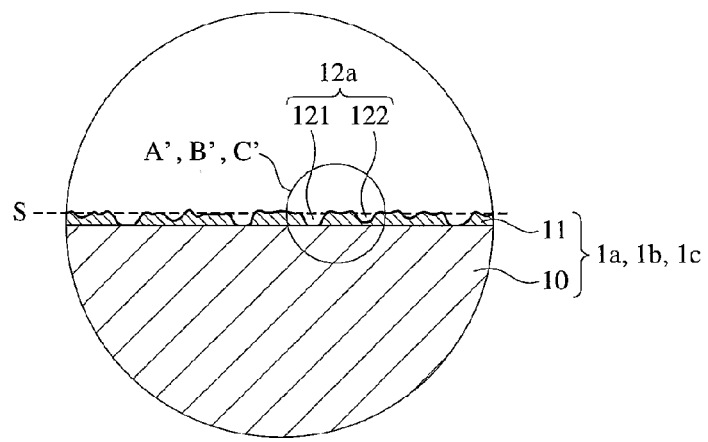
FIG. 2(b) is a cross-sectional view taken along the line C-C in FIG. 2(a).
Figure 2C:
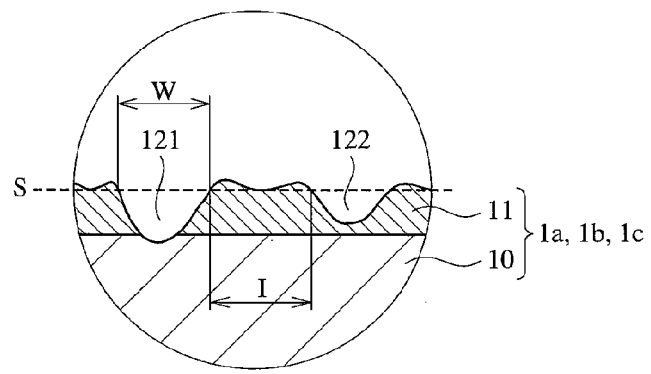
FIG. 2(c) is an enlarged cross-sectional view showing the portions A', B' and C' of FIG. 2(b).
Figure 3A:
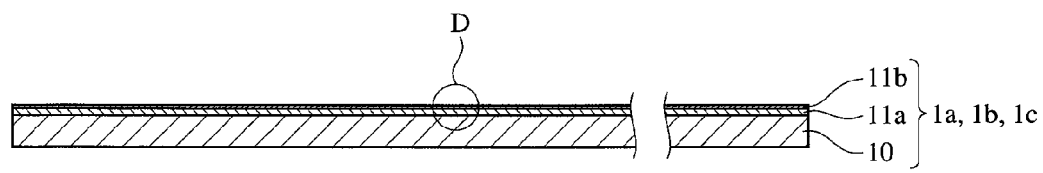
FIG. 3(a) is a cross-sectional view showing another example of electromagnetic-wave-absorbing film pieces.
Figure 3B:
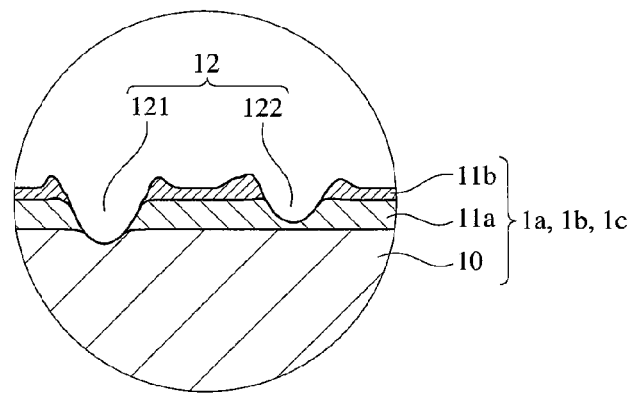
FIG. 3(b) is an enlarged cross-sectional view showing the portion D of FIG. 3(a).

The thin metal film 11 may have a single-layer structure as shown in FIGS. 2(a)-2(c), or a multi-layer structure as shown in FIGS. 3(a) and 3(b). The multi-layer, thin metal film 11 preferably comprises thin films 11a, 11b of first and second metals, one being a non-magnetic metal, and the other being a magnetic metal. The magnetic metals include nickel, cobalt, chromium or these alloys, and the non-magnetic metals include copper, silver, aluminum, tin or these alloys. A preferred combination is nickel and copper or aluminum. The thickness of the thin, magnetic metal film is preferably 0.01 µm or more, and the thickness of the thin, non-magnetic metal film is preferably 0.1 µm or more. Though not particularly restricted, the upper limit of the thickness may be practically about 10 µm for both thin metal films. More preferably, the thickness of the thin, magnetic metal film is 0.01-5 µm, and the thickness of the thin, non-magnetic metal film is 0.1-5 µm.

(c) Linear Scratches

In the examples shown in FIGS. 2(a)-2(c), the thin metal film 11 is provided with large numbers of substantially parallel, intermittent, linear scratches 12a, 12b oriented with irregular widths and intervals in two directions. The depth of the linear scratches 12 is exaggerated in FIG. 2(b) for the purpose of explanation. The linear scratches 12 oriented in two directions have various widths W and intervals I. The linear scratches 12 range from extremely thin linear scratches to extremely thick linear scratches with various widths W, and are irregularly aligned with various intervals I. The widths W of the linear scratches 12 and the intervals I of adjacent linear scratches 12 are determined at a height corresponding to the surface S of the thin metal film 11 before forming linear scratches. Some of the linear scratches 12 may be partially connected. Also, some linear scratches 12 penetrate the thin metal film 11 to the plastic film 10 (forming non-conductive portions 121), and some linear scratches 12 are relatively deep but not penetrate the thin metal film 11 (forming high-resistance portions 122). Because the linear scratches 12 are thus formed with irregular widths W and intervals I, the electromagnetic-wave-absorbing film piece of the present invention can efficiently absorb electromagnetic waves in a wide frequency range.

The widths W of the linear scratches 12 are preferably in a range of 0.1-100 µm for 90% or more, and 1-50 µm on average. Outside the above range, the electromagnetic-wave-absorbing film piece has low electromagnetic wave absorbability. 90% or more of the widths W of the linear scratches 12 are more preferably 0.1-50 µm, most preferably in a range of 0.1-20 µm. The average width Wav of the linear scratches 12 is more preferably 1-20 µm, most preferably 1-10 µm.

The intervals I of the linear scratches 12 are preferably in a range from 0.1-200 µm, more preferably in a range of 0.1-100 µm, most preferably in a range of 0.1-50 µm, particularly in a range of 0.1-20 µm. The average interval Iav of the linear scratches 12 is preferably 1-100 µm, more preferably 1-50 µm, most preferably 1-20 µm.

Because the lengths L of the linear scratches 12 are determined by sliding conditions (mainly relative peripheral speeds of the roll and film, and the angle of the film winding around the roll), they are substantially the same (substantially equal to the average length), unless the sliding conditions are changed. The lengths of the linear scratches 12 may be practically about 1-100 mm, though not particularly restrictive.

Figure 4A:
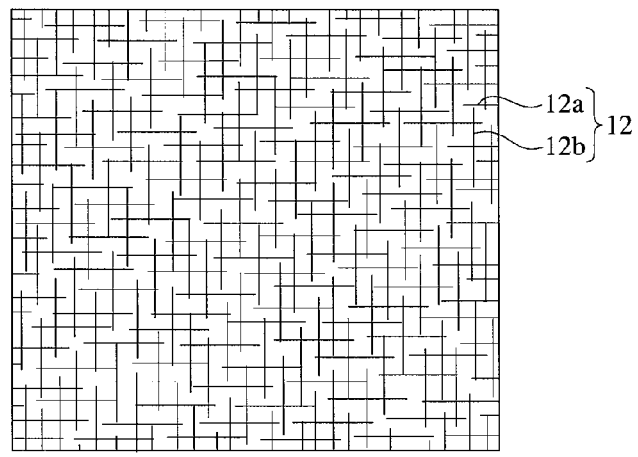
FIG. 4(a) is a plan view showing an electromagnetic-wave-absorbing film piece in which the crossing angle of linear scratches is 90°.
Figure 4B:
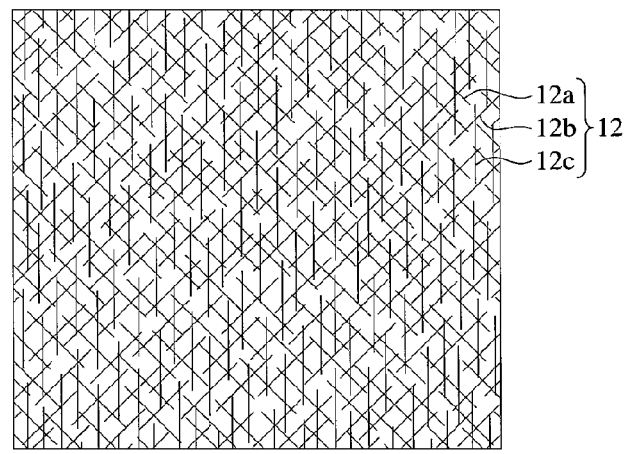
FIG. 4(b) is a plan view showing an electromagnetic-wave-absorbing film piece having three-direction linear scratches.
Figure 4C:
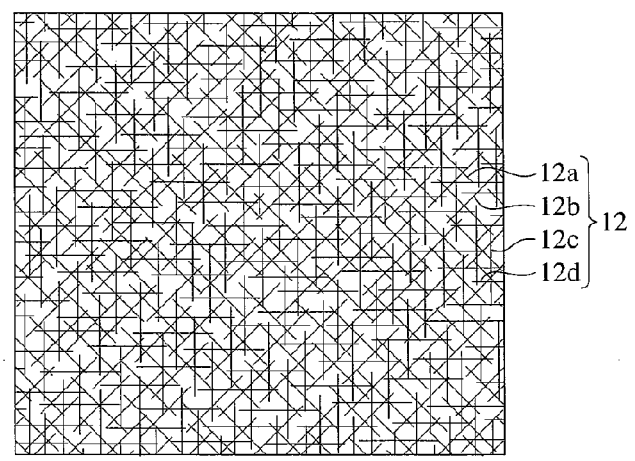
FIG. 4(c) is a plan view showing an electromagnetic-wave-absorbing film piece having four-direction linear scratches.

FIGS. 4(a)-4(c) show other patterns of the linear scratches 12. By properly setting sliding conditions (the number and axial directions of pattern rolls, the relative peripheral speed of pattern rolls and a film, etc.), various patterns of linear scratches 12 with different orientations and numbers can be obtained. The linear scratches 12 shown in FIG. 4(a) comprise linear scratches 12a, 12b with a crossing angle θs of 90°, the linear scratches 12 shown in FIG. 4(b) comprise three-direction linear scratches 12a, 12b, 12c, and the linear scratches 12 shown in FIG. 4(c) comprise four-direction linear scratches 12a, 12b, 12c, 12d.

(d) Fine Pores

Figure 5A:
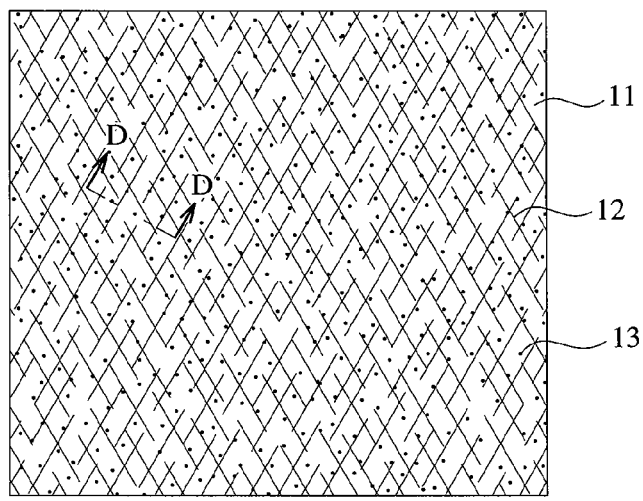
FIG. 5(a) is a plan view showing a further example of electromagnetic-wave-absorbing film pieces.
Figure 5B:
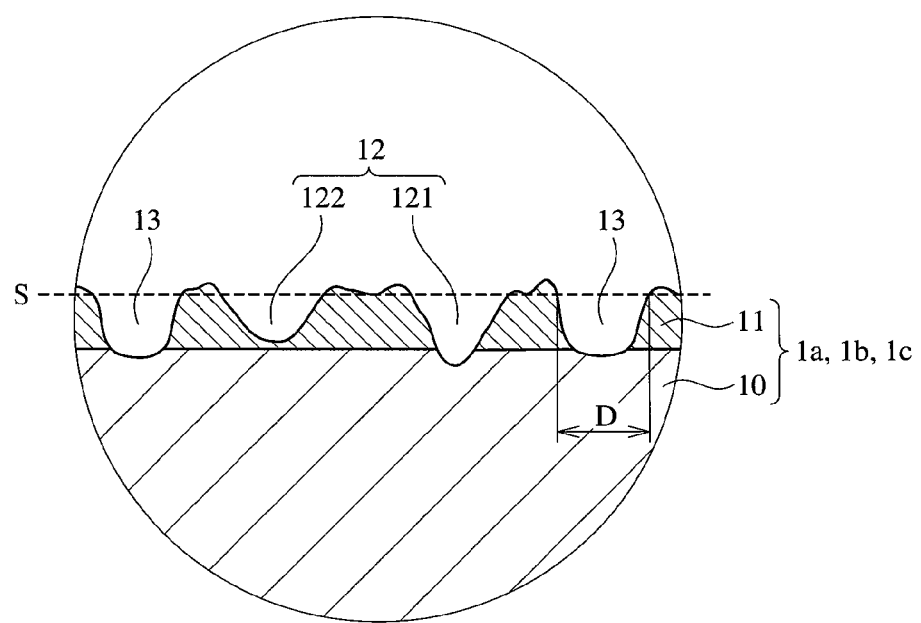
FIG. 5(b) is a cross-sectional view taken along the line D-D in FIG. 5(a).

FIGS. 5(a) and 5(b) show another example of electromagnetic-wave-absorbing film pieces having a single-layer, thin metal film. In this example, the thin metal film 11 is provided with a large number of penetrating fine pores 13 at random, in addition to the linear scratches 12. The fine pores 13 can be formed by pressing a roll having fine, high-hardness particles on the surface to the thin metal film 11. As shown in FIG. 5(b), the opening diameters D of the fine pores 13 are determined at a height corresponding to the surface S of the thin metal film 11 before forming the linear scratches. 90% or more of the opening diameters D of the fine pores 13 are preferably in a range of 0.1-100 µm, more preferably in a range of 0.1-50 µm. The average opening diameter Dav of the fine pores 13 is preferably in a range of 0.5-50 µm, more preferably in a range of 1-30 µm. The upper limit of the average opening diameter Dav is more preferably 20 µm, most preferably 10 µm. The average density of the fine pores 13 is preferably 500/cm$^2$ or more, more preferably 5000-50000/cm$^2$.

(2) Surface Resistance

The surface resistances of the first to third electromagnetic-wave-absorbing film pieces 1a-1c are preferably 20 Ω/square to 1 kΩ/square, more than 1 kΩ/square and less than 3.5 kΩ/square, and 3.5 kΩ/square to 1 MΩ/square, respectively. This makes it possible to obtain excellent electromagnetic wave absorbability regardless of incident directions, namely regardless of whether polarized waves are TE waves whose electric field components are perpendicular to an incident plane or TM waves whose magnetic field components are perpendicular to an incident plane.

The surface resistance of the first electromagnetic-wave-absorbing film piece 1a is more preferably 100-800 Ω/square, most preferably 200-700 Ω/square. The surface resistance of the second electromagnetic-wave-absorbing film piece 1b is more preferably 1.5 kΩ/square or more and less than 3.5 kΩ/square, most preferably 2 kΩ/square or more and less than 3.5 kΩ/square. The surface resistance of the third electromagnetic-wave-absorbing film piece 1c is more preferably 3.5 kΩ/square to 500 kΩ/square, most preferably 3.5 kΩ/square to 100 kΩ/square. The surface resistance of the electromagnetic-wave-absorbing film pieces 1a-1c can be adjusted by the material and thickness of the thin metal film 11, and the width, interval, length, etc. of the linear scratches 12. The surface resistance can be measured by a DC two-terminal method.

To absorb TE waves and TM waves more efficiently, it is preferable that the first and second electromagnetic-wave-absorbing film pieces have surface resistance difference of 1 kΩ/square or more, and that the second and third electromagnetic-wave-absorbing film pieces have surface resistance difference of 500 Ω/square or more. More preferably, the former is 1.5 kΩ/square or more, and the latter is 700 Ω/square or more.

(2) Area Ratios of Electromagnetic-Wave-Absorbing Film Pieces

The area ratios of the first to third electromagnetic-wave-absorbing film pieces 1a-1c are preferably 50-70%, 10-20% and 20-30%, respectively, based on the total area ratio (100%).

(3) Shape and Arrangement of Electromagnetic-Wave-Absorbing Film Pieces

Figure 6:
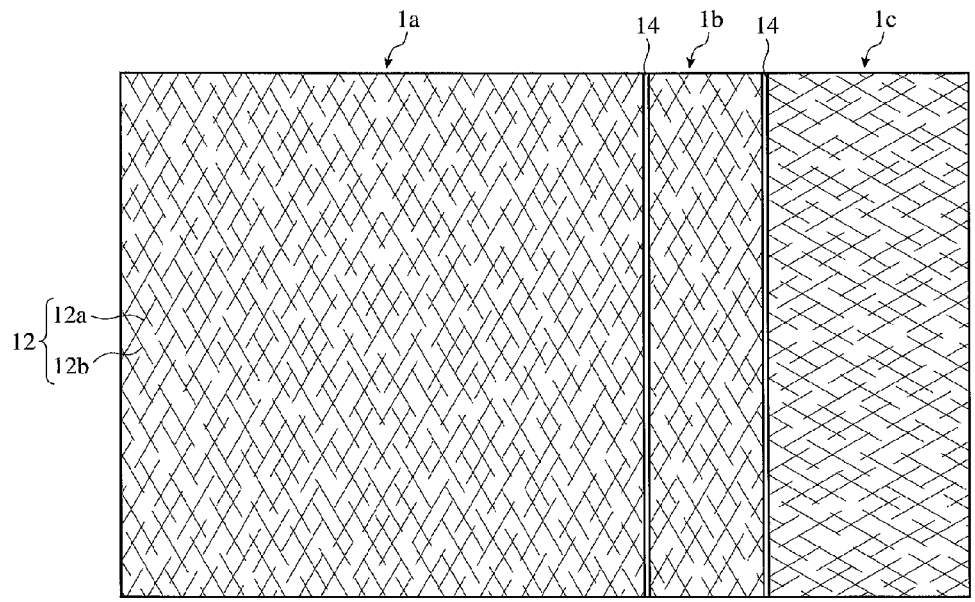
FIG. 6 is a plan view showing a composite electromagnetic-wave-absorbing film according to another embodiment of the present invention.

The outer shapes of the electromagnetic-wave-absorbing film pieces 1a-1c are preferably rectangular (including square), but they may be circular, triangular, or irregular, etc. As shown in FIGS. 1(a)-1(c), an assembly of rectangular, electromagnetic-wave-absorbing film pieces 1a-1c is preferably rectangular, and each of the rectangular, electromagnetic-wave-absorbing film pieces 1b and 1c is more preferably adjacent to a side of the rectangular, electromagnetic-wave-absorbing film piece 1a. Of course, as shown in FIG. 6, the electromagnetic-wave-absorbing film pieces 1a-1c may be arranged in a stripe pattern. Such a rectangular assembly preferably has an aspect ratio substantially equal to a golden ratio. The size of this rectangular assembly may be properly determined depending on its applications.

As shown in FIGS. 1(a)-1(c), the electromagnetic-wave-absorbing film pieces 1a-1c are preferably arranged with small gaps 14. Though not restrictive, the width d of the gap 14 is preferably 0.1-5 mm, more preferably 0.5-3 mm. It is presumed that the gaps 14 as well as a large number of linear scratches 12 attenuate electromagnetic waves, so that the composite electromagnetic-wave-absorbing film has electromagnetic wave absorbability with small anisotropy. The electromagnetic-wave-absorbing film pieces 1a-1c may be adhered to the plastic base film 10a on the side of the thin metal films 11.

(4) Crossing Angle and Orientation of Linear Scratches

Figure 7:
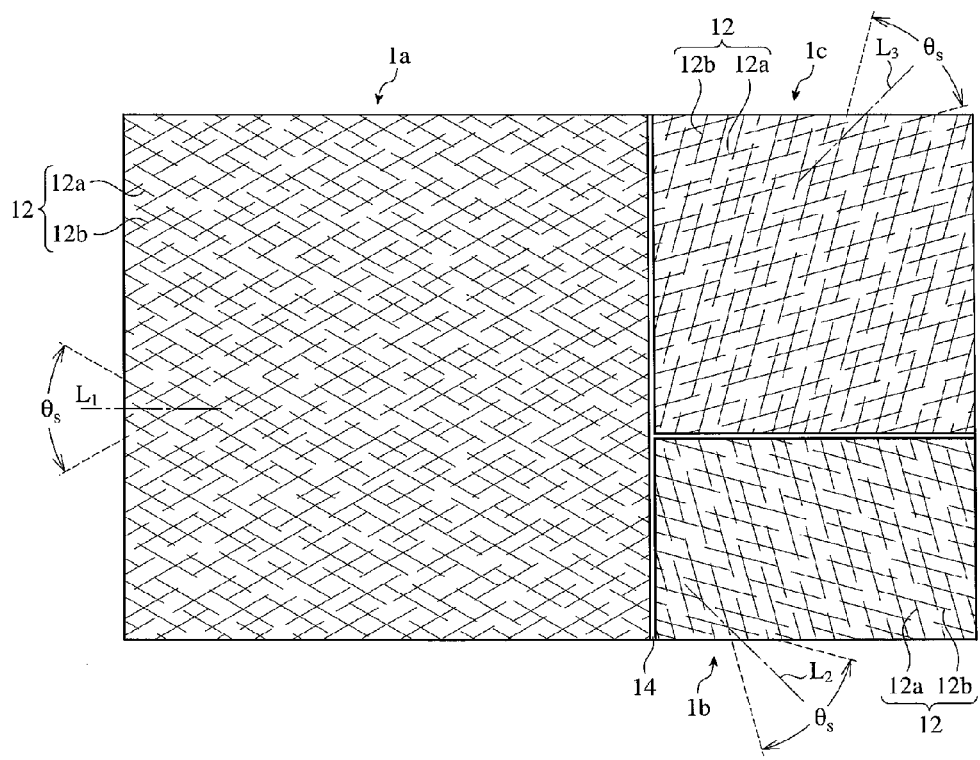
FIG. 7 is a plan view showing a composite electromagnetic-wave-absorbing film according to a further embodiment of the present invention.

Because the linear scratches 12 are formed on a long composite film (plastic film 10 having a thin metal film 11 on at least one surface) by pattern rolls, the crossing angle (on the acute angle side) θs of linear scratches 12a, 12b can be properly determined depending on the sliding conditions of the composite film to the pattern rolls (axial directions of the pattern rolls, the relative peripheral speed of pattern rolls and a film, etc.). The crossing angle θs of the linear scratches 12a, 12b is preferably 30-90°, more preferably 45-90°, most preferably 60-90°. Two or all of the crossing angles θs of the films 1a-1c may be the same, or all crossing angles may be different. The orientations of the centerlines $L_1$-$L_3$ of the crossing angles θs are not restrictive, but may be properly set. FIG. 7 shows an example in which the crossing angles θs have differently oriented centerlines $L_1$-$L_3$. The electromagnetic-wave-absorbing film pieces 1a-1c are preferably arranged such that their centerlines $L_1$-$L_3$ are parallel or perpendicular to each other. More preferably, as shown in FIG. 1(a), the electromagnetic-wave-absorbing film pieces 1a-1c are arranged, such that the electromagnetic-wave-absorbing film pieces 1a and 1b have crossing angles θs with parallel centerlines $L_1$ and $L_2$, and that the electromagnetic-wave-absorbing film pieces 1a and 1c have crossing angles θs with perpendicular centerlines $L_1$ and $L_3$.

(5) Plastic Base Film

Resins for the plastic base film 10a may be the same as those for the plastic film 10 of the electromagnetic-wave-absorbing film piece.

(6) Protective Layer

Figure 8:
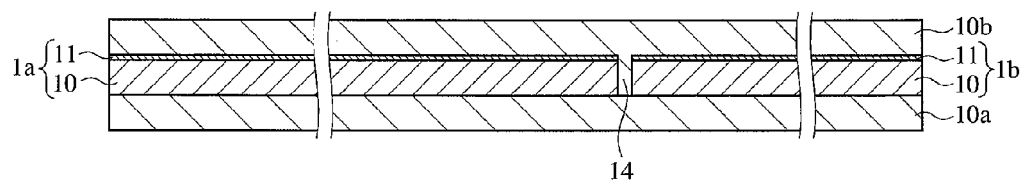
FIG. 8 is a cross-sectional view showing an electromagnetic-wave-absorbing film according to a still further embodiment of the present invention.

As shown in FIG. 8, the thin metal film 11 of the composite electromagnetic-wave-absorbing films may be coated with a protective plastic layer 10b. The protective layer 10b is preferably as thick as 10-100 µm.

Figure 9:
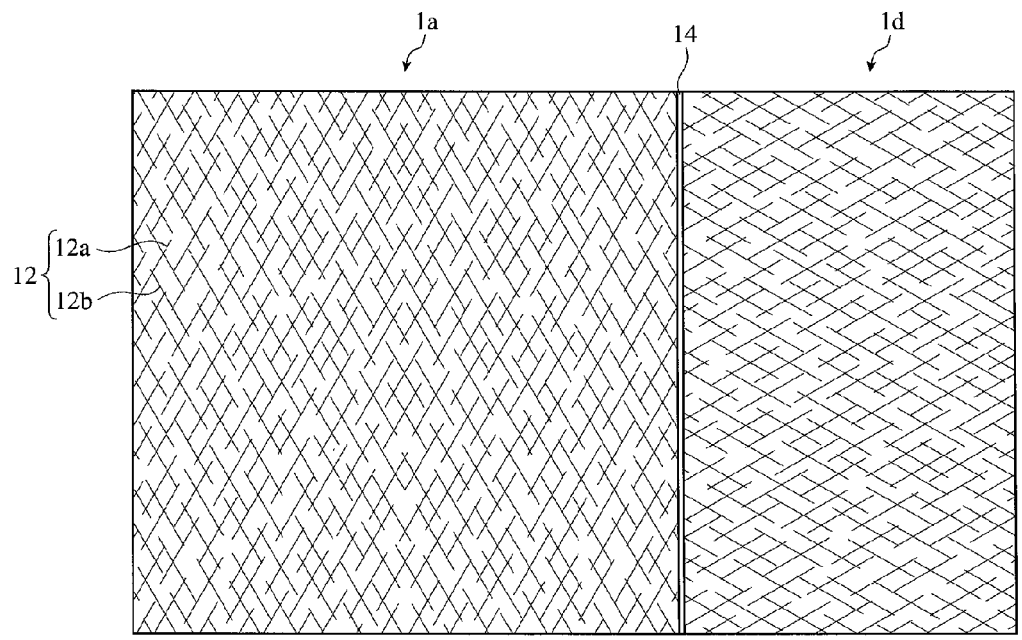
FIG. 9 is a plan view showing an composite electromagnetic-wave-absorbing film according to a still further embodiment of the present invention.

FIG. 9 shows a further example of the composite electromagnetic-wave-absorbing film of the present invention. In this composite electromagnetic-wave-absorbing film, two rectangular electromagnetic-wave-absorbing film pieces 1a and 1d different in at least one of width, interval, length and direction are arranged adjacently. The electromagnetic-wave-absorbing film piece 1d preferably has surface resistance of more than 1 kΩ/square to 1 MΩ/square and an area ratio of 30-50%. Except for them, it may be the same as the above examples of the composite electromagnetic-wave-absorbing films. The surface resistance of the electromagnetic-wave-absorbing film piece 1d is more preferably 1.5 kΩ/square to 500 kΩ/square, most preferably 2 kΩ/square to 100 kΩ/square. Surface resistance difference between the electromagnetic-wave-absorbing film pieces 1a and 1d is preferably 1 kΩ/square or more.

[2] Production Method of Composite Electromagnetic-Wave-Absorbing Film

The composite electromagnetic-wave-absorbing film of the present invention can be produced by (a) producing pluralities of composite films each having a single-layer or multilayer conductor layer on at least one surface of a plastic film, (b) forming a large number of substantially parallel, intermittent, linear scratches with irregular widths and intervals in plural directions on the conductor layer of each composite film, to provide pluralities of long electromagnetic-wave-absorbing films having linear scratches different in at least one of width, interval, length and direction, (c) cutting each long electromagnetic-wave-absorbing film to electromagnetic-wave-absorbing film pieces each having a predetermined shape, and (d) adhering a desired combination of electromagnetic-wave-absorbing film pieces to a plastic base film.

(1) Production of Composite Film

A long electromagnetic-wave-absorbing film having a single-layer or multi-layer conductor layer (thin metal film) can be produced by forming the thin metal film 11 on at least one surface of the plastic film 10 by vapor deposition methods (physical vapor deposition methods such as a vacuum vapor deposition method, a sputtering method and an ion plating method, or chemical vapor deposition methods such as a plasma CVD method, a thermal CVD method and a photo CVD method), plating methods, or foil-bonding methods.

(2) Formation of Linear Scratches (a) Linear-Scratches-Forming Apparatus

FIGS. 10(a) to 10(e) show one example of apparatuses for forming linear scratches oriented in two directions. This linear-scratches-forming apparatus comprises (i) a reel 21 from which a composite film 100 having a thin metal film 11 on a surface of a plastic film 10 is wound off, (ii) pluralities of guide rolls 22, (iii) a first pattern roll 2a having a large number of high-hardness fine particles on the surface and arranged in a different direction from the transverse direction of the composite film 100 on the side of the thin metal film 11, (iv) a first push roll 3a arranged upstream of the first pattern roll 2a on the opposite side to the thin metal film 11, (v) a second pattern roll 2b having a large number of high-hardness fine particles on the surface and arranged in an opposite direction to the first pattern roll 2a with respect to the transverse direction of the composite film 100 on the side of the thin metal film 11, (vi) a second push roll 3b arranged downstream of the second pattern roll 2b on the opposite side to the thin metal film 11, (vii) an electric-resistance-measuring means 4a arranged on the side of the thin metal film 11 between the first and second pattern rolls 2a, 2b, (viii) an electric-resistance-measuring means 4b arranged downstream of the second pattern roll 2b on the side of the thin metal film 11, (ix) pluralities of guide rolls 23, and (x) a reel 24, around which the electromagnetic-wave-absorbing film 1 having linear scratches is wound, in this order from upstream. Each pattern roll 2a, 2b is supported by a backup roll 5a, 5b to prevent small bending. The backup rolls 5a, 5b are preferably rubber rolls to avoid adverse effect on the pattern rolls 2a, 2b.

Figure 10A:
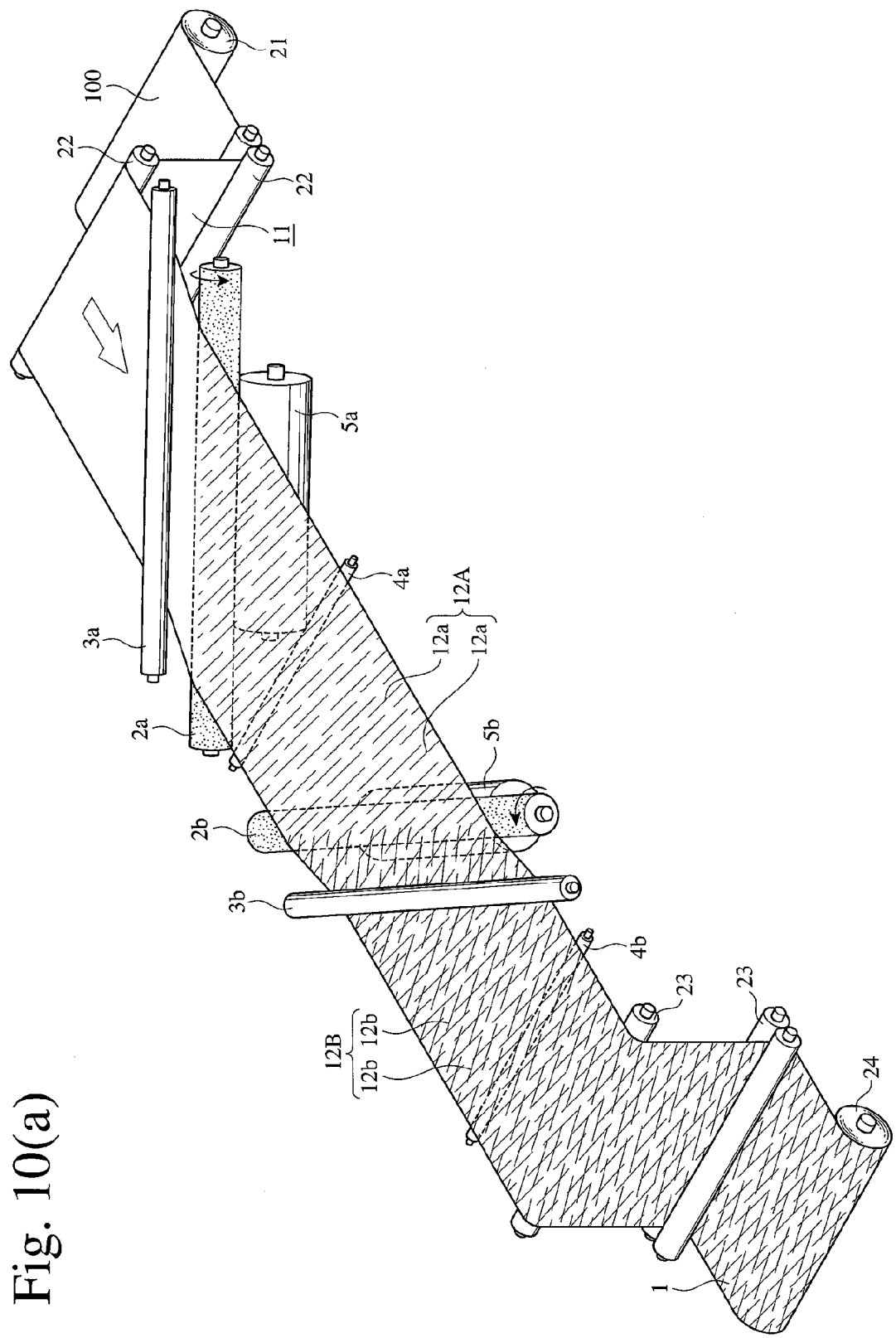
FIG. 10(a) is a perspective view showing one example of linear-scratches-forming apparatuses.
Figure 10B:
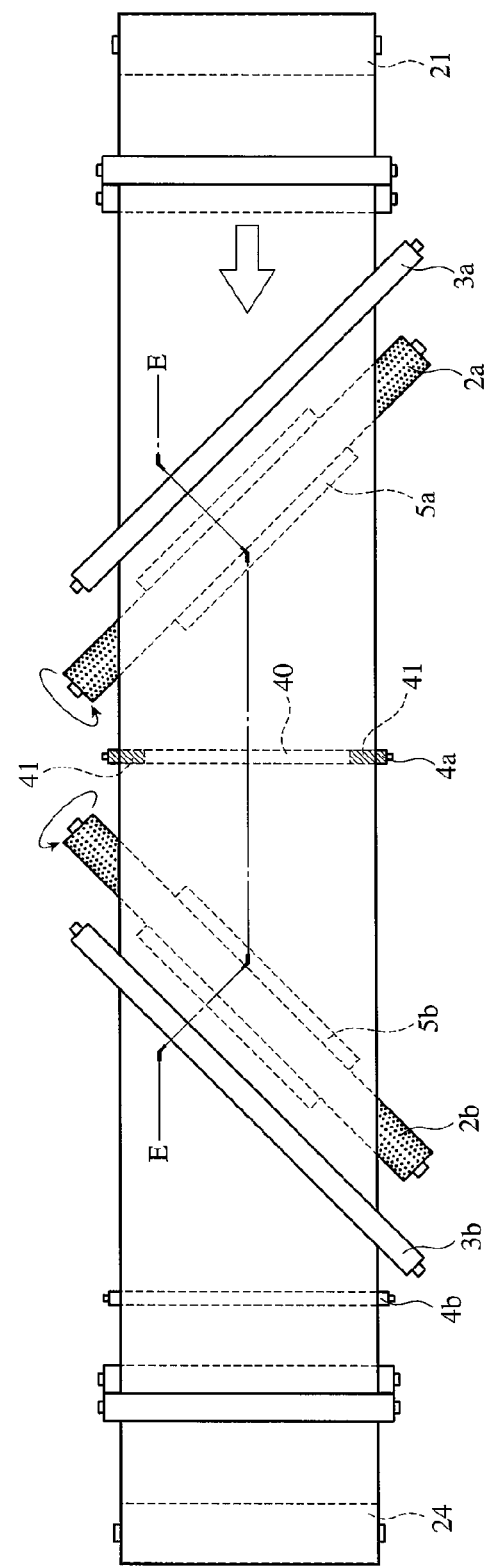
FIG. 10(b) is a plan view showing the linear-scratches-forming apparatus of FIG. 10(a).
Figure 10C:
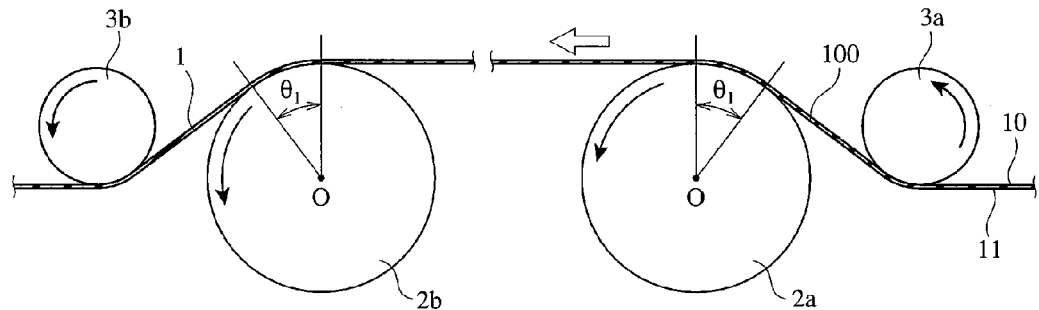
FIG. 10(c) is a cross-sectional view taken along the line E-E in FIG. 10(b).

As shown in FIG. 10(c), the vertical position of each push roll 3a, 3b is lower than a position at which the composite film 100 is brought into sliding contact with each pattern roll 2a, 2b, such that the composite film 100 slides on each pattern roll 2a, 2b with the thin metal film 11 pushed. With this condition met, the vertical position of each push roll 3a, 3b may be adjusted to control the pressing power of each pattern roll 2a, 2b to the thin metal film 11, and the sliding distance represented by the center angle $\theta_1$.

Figure 10D:
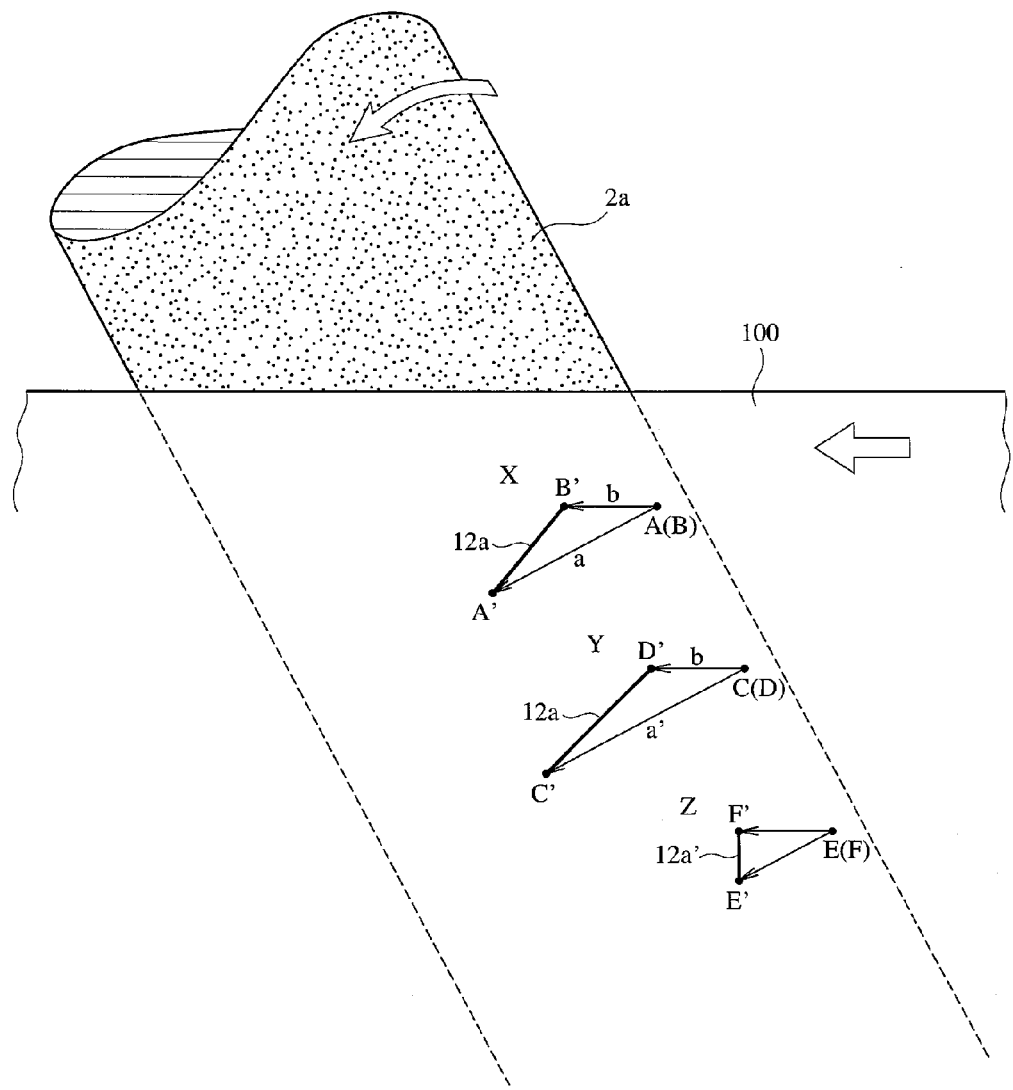
FIG. 10(d) is a partial, enlarged plan view for explaining the principle of forming linear scratches inclined to the moving direction of the plastic film.
Figure 10E:
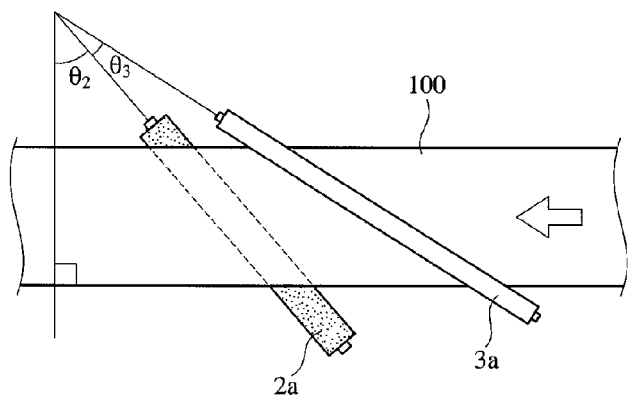
FIG. 10(e) is a partial plan view showing the inclination angles of a pattern roll and a push roll to a plastic film in the linear-scratches-forming apparatus of FIG. 10(a).

FIG. 10(d) shows the principle that linear scratches 12a are formed on the composite film 100 with inclination to the moving direction thereof. Because the pattern roll 2a is inclined to the moving direction of the composite film 100, the moving direction (rotation direction) a of fine, hard particles on the pattern roll 2a differs from the moving direction b of the composite film 100. After a fine, hard particle on a point A on the pattern roll 2a comes into contact with the thin metal film of the composite film 100 to form a scratch B at an arbitrary time as shown by X, the fine, hard particle moves to a point A', and the scratch B moves to a point B', in a predetermined period of time. While the fine, hard particle moves from the point A to the point A', the scratch is continuously formed, resulting in a linear scratch 12a extending from the point B' to the point A'.

The directions and crossing angle θs of the first and second linear scratch groups 12A, 12B formed by the first and second pattern rolls 2a, 2b can be adjusted by changing the angle of each pattern roll 2a, 2b to the composite film 100, and/or the peripheral speed of each pattern roll 2a, 2b relative to the moving speed of the composite film 100. For instance, when the peripheral speed a of the pattern roll 2a relative to the moving speed b of the composite film 100 increases, the linear scratches 12a can be inclined 45° to the moving direction of the composite film 100 like a line C'D' as shown by Y in FIG. 10(d). Similarly, the peripheral speed a of the pattern roll 2a can be changed by changing the inclination angle $\theta_2$ of the pattern roll 2a to the transverse direction of the composite film 100. This is true of the pattern roll 2b. Accordingly, with both pattern rolls 2a, 2b adjusted, the directions of the linear scratches 12a, 12b can be changed.

Because each pattern roll 2a, 2b is inclined to the composite film 100, sliding contact with each pattern roll 2a, 2b is likely to exert a force in a transverse direction onto the composite film 100, causing the lateral displacement of the composite film 100. To prevent the lateral displacement of the composite film 100, the vertical position and/or angle of each push roll 3a, 3b to each pattern roll 2a, 2b are preferably adjusted. For instance, the proper adjustment of a crossing angle $\theta_3$ between the axis of the pattern roll 2a and the axis of the push roll 3a provides pressing power with such a transverse direction distribution as to cancel transverse components, thereby preventing the lateral displacement. The adjustment of the distance between the pattern roll 2a and the push roll 3a also contributes to the prevention of the lateral displacement.

To prevent the lateral displacement and breakage of the composite film 100, the rotation directions of the first and second pattern rolls 2a, 2b are preferably the same as the moving direction of the composite film 100.

As shown in FIG. 10(b), each electric-resistance-measuring means (roll) 4a, 4b comprises a pair of electrodes 41, 41 at both ends via an insulating portion 40, between which the electric resistance of the thin metal film 11 with linear scratches 12a, 12b is measured. The electric resistance measured by the electric-resistance-measuring rolls 4a, 4b is compared with the target electric resistance, to adjust the operation conditions depending on their difference. The operation conditions controlled are the moving speed of the composite film 100, the rotation speeds and inclination angles $\theta_2$ of the pattern rolls 2a, 2b, the vertical positions of the push rolls 3a, 3b, the distances of the push rolls 3a, 3b from the pattern rolls 2a, 2b, the inclination angles $\theta_3$ of the push rolls 3a, 3b to the pattern rolls 2a, 2b, etc.

Figure 11:
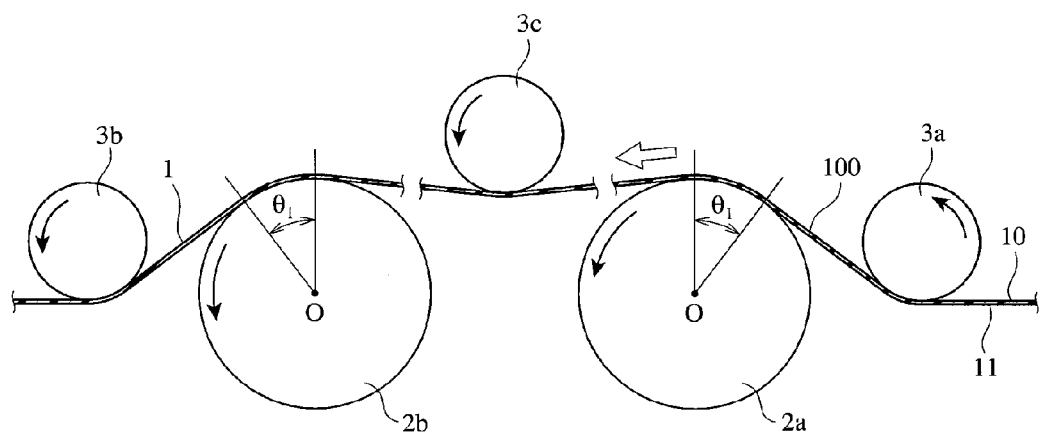
FIG. 11 is a partial cross-sectional view schematically showing another example of the linear-scratches-forming apparatuses.

As shown in FIG. 11, the arrangement of a third push roll 3c between the pattern rolls 2a, 2b increases a force of pushing the thin metal film 11 of the composite film 100 onto the pattern rolls 2a, 2b, and increases the sliding distance of the thin metal film 11 expressed by a center angle $\theta_1$, providing the linear scratches 12a, 12b with larger depths and widths. In addition, it prevents the lateral displacement of the composite film 100.

Figure 12:
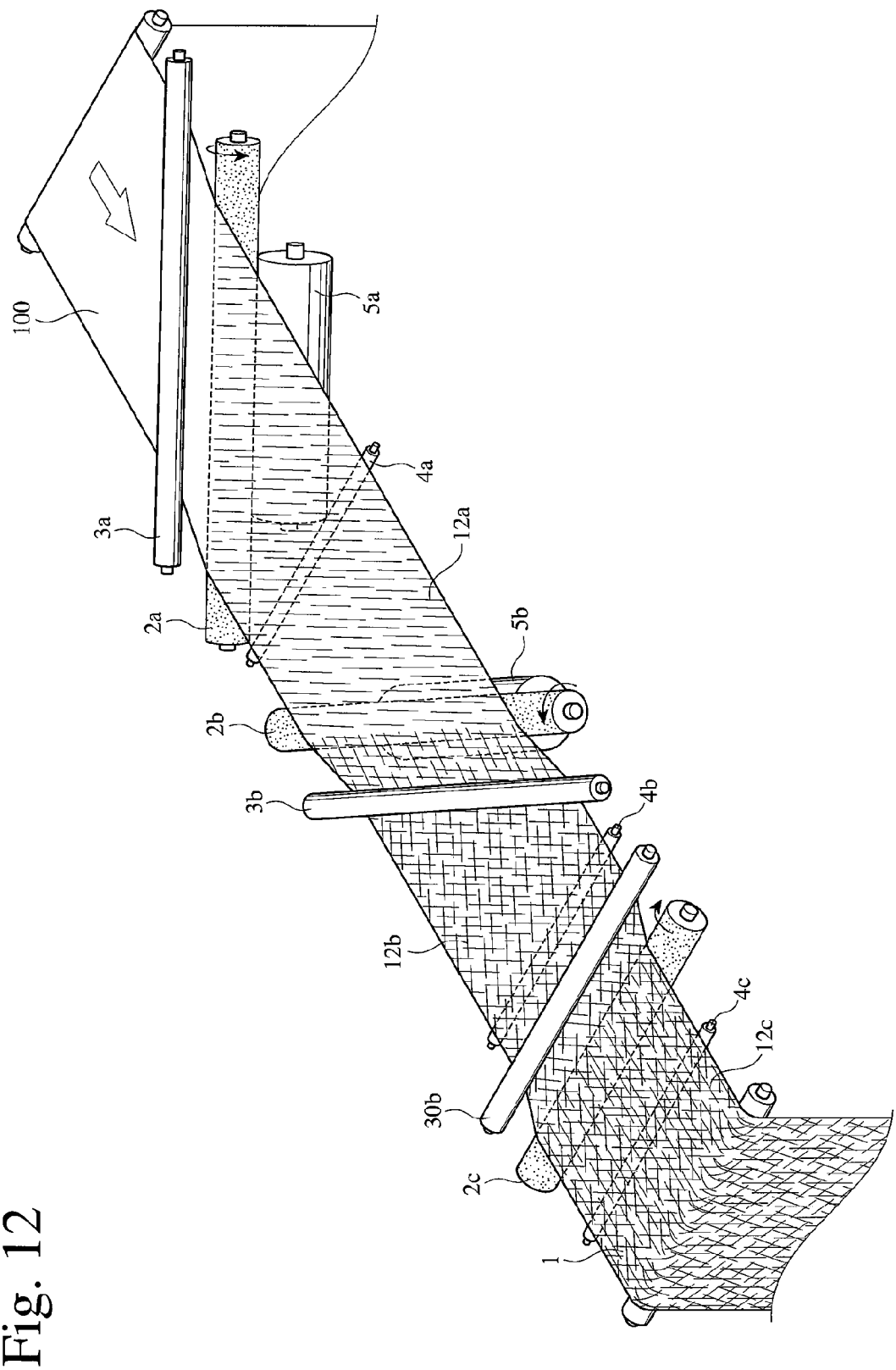
FIG. 12 is a perspective view showing a further example of the linear-scratches-forming apparatuses.

FIG. 12 shows one example of apparatuses for forming linear scratches oriented in three directions as shown in FIG. 4(b). This apparatus is the same as the apparatus shown in FIGS. 10(a) to 10(e), except that it comprises a third pattern roll 2c, a third push roll 30b and an electric-resistance-measuring roll 4c downstream of the second pattern roll 2b. The rotation direction of the third pattern roll 2c may be the same as or opposite to the moving direction of the composite film 100. The third pattern roll 2c arranged in the transverse direction forms linear scratches 12c aligned with the moving direction of the composite film 100. The third push roll 30b may be arranged upstream or downstream of the third pattern roll 2c.

Figure 13:
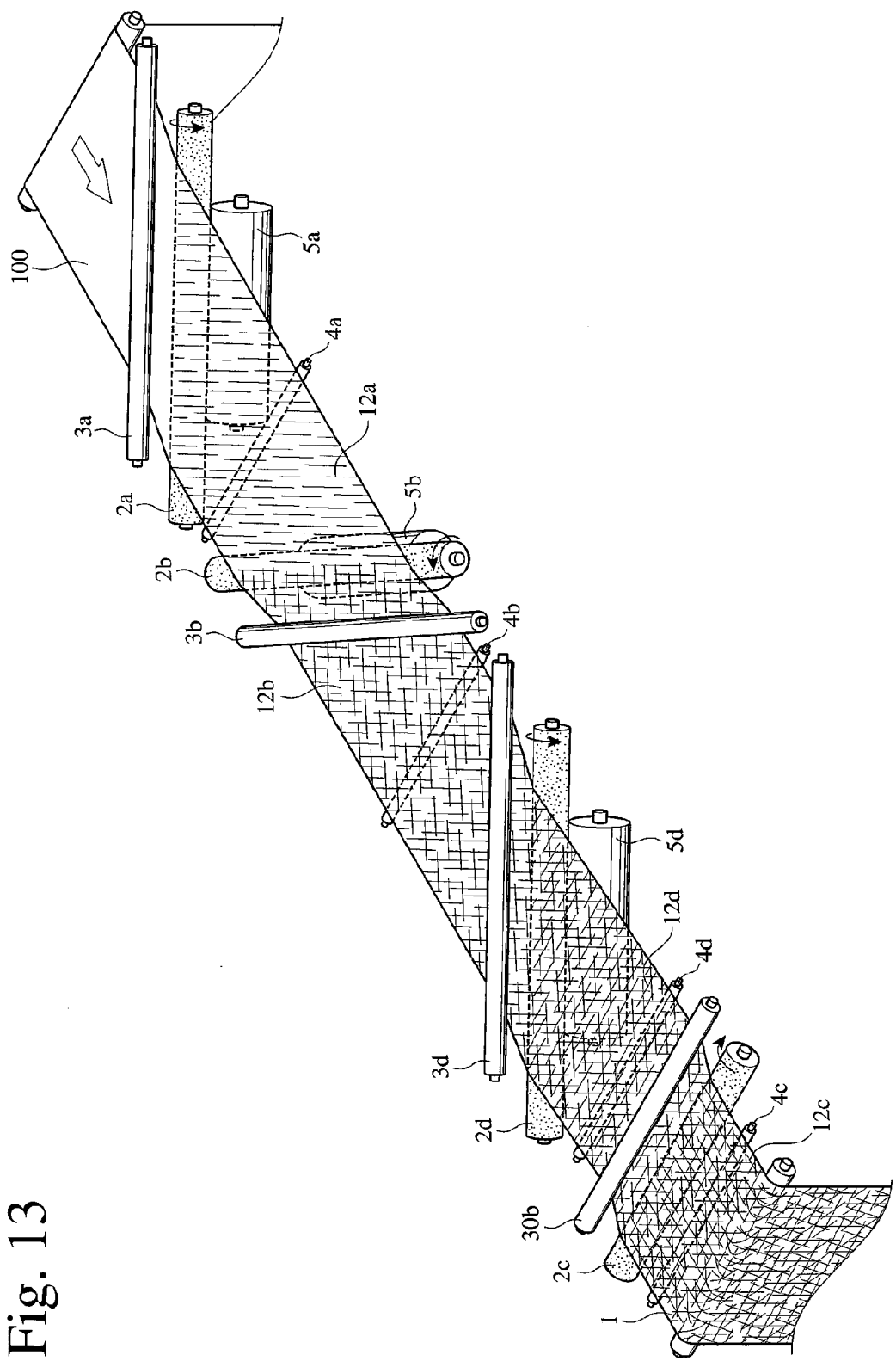
FIG. 13 is a perspective view showing a still further example of the linear-scratches-forming apparatuses.

FIG. 13 shows one example of apparatuses for forming linear scratches oriented in four directions as shown in FIG. 4(c). This apparatus is the same as the apparatus shown in FIG. 12, except that it comprises a fourth pattern roll 2d between the second pattern roll 2b and the third pattern roll 2c, and a fourth push roll 3d upstream of the fourth pattern roll 2d. With a slower rotation speed of the fourth pattern roll 2d, the direction (line E'F') of linear scratches 12a' can be made in parallel to the transverse direction of the composite film 100 as shown by Z in FIG. 10(d).

Figure 14:
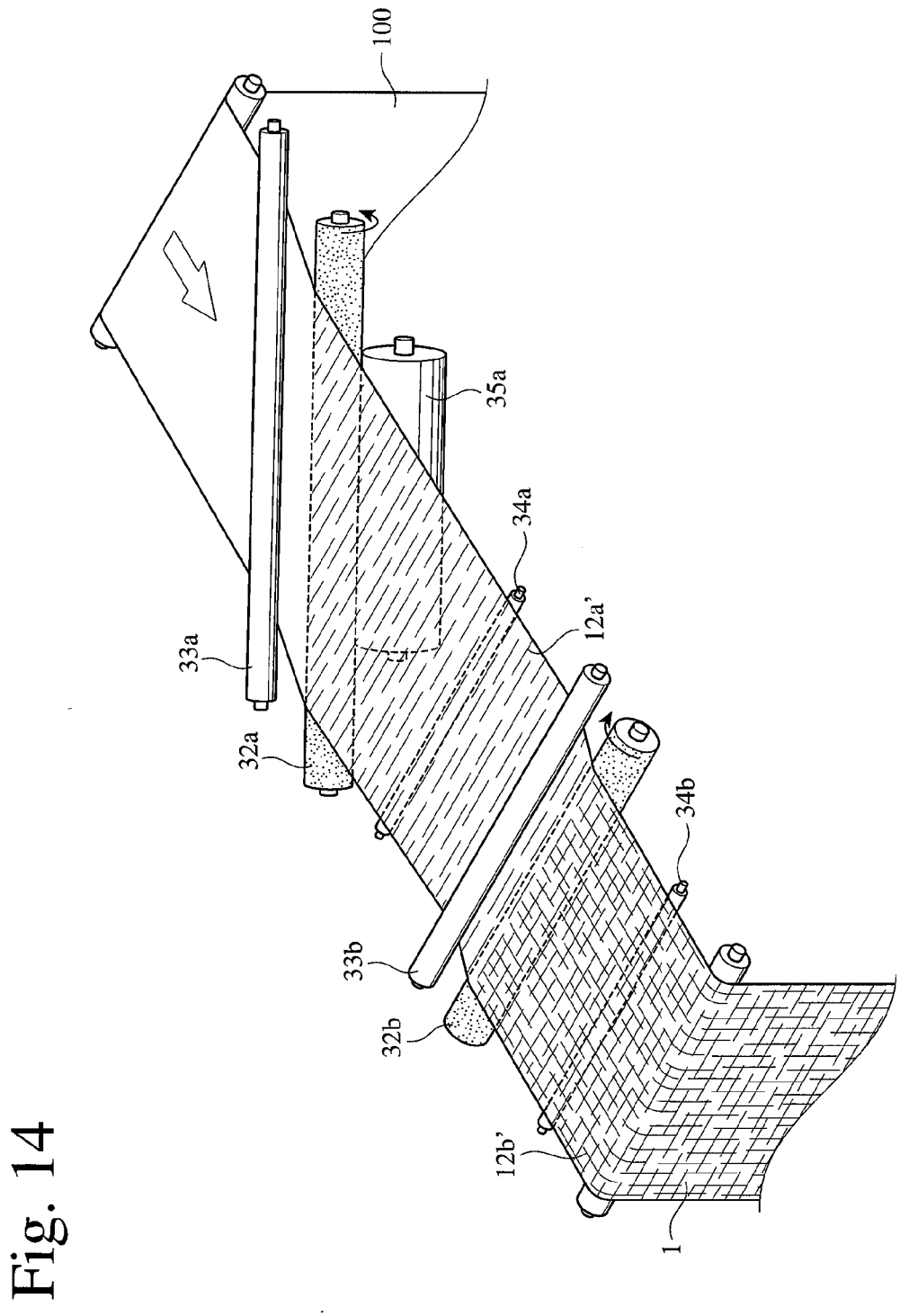
FIG. 14 is a perspective view showing a still further example of the linear-scratches-forming apparatuses.

FIG. 14 shows an example of apparatuses for forming linear scratches extending perpendicularly in longitudinal and transverse directions as shown in FIG. 4(a). This linear-scratches-forming apparatus is essentially different from the apparatus shown in FIGS. 10(a) to 10(e), in that the second pattern roll 32b is in parallel to the transverse direction of the composite film 100. Only portions different from those shown in FIGS. 10(a) to 10(e) will thus be explained. The rotation direction of the second pattern roll 32b may be the same as or opposite to the moving direction of the composite film 100. Also, the second push roll 33b may be upstream or downstream of the second pattern roll 32b. This apparatus makes the direction (line E'F') of linear scratches 12a' in alignment with the transverse direction of the composite film 100 as shown by Z in FIG. 10(d), suitable for forming linear scratches shown in FIG. 4(c).

(b) Operation Conditions

Operation conditions determining not only the inclination angles and crossing angles of linear scratches but also their depths, widths, lengths and intervals are the moving speed of the composite film, the rotation speeds and inclination angles $\theta_2$ of the pattern rolls, and the tension of the composite film (determined by vertical positions of the push rolls, distances and inclination angles $\theta_3$ from the pattern rolls, etc.), etc. The moving speed of the composite film is preferably 5-200 m/minute, and the rotation speed (peripheral speed) of the pattern roll is preferably 10-2,000 m/minute. The inclination angles $\theta_2$ are preferably 20°-60°, particularly about 45°. The tension of the composite film is preferably 0.05-5 kgf/cm width.

(c) Pattern Rolls

The pattern roll for forming linear scratches is preferably a roll having fine particles with sharp edges and Mohs hardness of 5 or more on the surface, for instance, the diamond roll described in JP 2002-59487 A. Because the widths of linear scratches are determined by the sizes of fine particles, 90% or more of fine diamond particles preferably have sizes in a range of 1-100 μm, more preferably in a range of 10-50 μm. The fine diamond particles are attached to the roll surface preferably in an area ratio of 30% or more.

(3) Formation of Fine Pores

The thin metal film 11 having linear scratches 12 may be provided with large numbers of fine pores 13 by the method described in Japanese Patent 2063411. For example, fine pores are formed by passing the composite film 100 through a gap between a first roll having a large number of fine particles with acute corners and Mohs hardness of 5 or more on the surface, which may be the same as the above linear-scratches-forming roll, and a second smooth-surface roll pushed toward the first roll, with the thin metal film 11 on the side of the first roll at the same speed as the peripheral speed of the first roll.

(4) Cutting of Electromagnetic-Wave-Absorbing Film

Pluralities of the resultant long electromagnetic-wave-absorbing films with different linear scratches are cut to provide pluralities of electromagnetic-wave-absorbing film pieces having desired shapes.

(5) Adhesion of Electromagnetic-Wave-Absorbing Film Pieces

Pluralities of electromagnetic-wave-absorbing film pieces with different linear scratches are adhered to a plastic base film 10a with predetermined gaps by a heat lamination method, an adhesion method, etc., to produce a composite electromagnetic-wave-absorbing film. After the adhesion of the electromagnetic-wave-absorbing film pieces, a plastic film may be adhered to the thin metal films 11 by a heat lamination method, etc. to form a protective plastic layer 10b.

The present invention will be explained in more detail referring to Examples below without intention of restricting it thereto.

EXAMPLE 1

A 0.05-μm-thick aluminum layer was formed on a surface of a biaxially oriented polyethylene terephthalate (PET) film [thickness: 12 μm, dielectric constant: 3.2 (1 MHz), dielectric tangent: 1.0% (1 MHz), and melting point: 265° C.] by a vacuum vapor deposition method, to produce a composite film.

Using the apparatus shown in FIG. 10(a), the composite film 100 was brought into sliding contact with pattern rolls 2a, 2b on which fine diamond particles having a particle size distribution of 50-80 μm were electrodeposited, with the aluminum layer on the side of the pattern rolls 2a, 2b, to form linear scratches oriented in two directions as shown in FIG. 2(a) under properly set operation conditions (the moving speed of the composite film, the rotation speeds and inclination angles $\theta_2$ of the pattern rolls 2a, 2b, the winding angle $\theta_1$ of the film, and the tension of the composite film). Optical photomicrographical observation revealed that linear scratches in the resultant electromagnetic-wave-absorbing film had the following properties.

| | |
|---|---|
| Range of widths W | 0.5-5 μm, |
| Average width Wav | 2 μm, |
| Range of intervals I | 2-30 μm, |
| Average interval Iav | 20 μm, |
| Average length Lav | 5 mm, and |
| Acute crossing angle θs of linear scratches | 60°. |

An aluminum layer of an electromagnetic-wave-absorbing film piece (32 cm×33 cm) cut out of the above electromagnetic-wave-absorbing film had surface resistance (measured by a DC two-terminal method and averaged) of 377 Ω/square. Produced in the same manner as above except for changing the operation conditions of the apparatus were an electromagnetic-wave-absorbing film piece (20 cm×12 cm) having an aluminum layer having linear scratches with a crossing angle θs of 60° and surface resistance of 3.4 kΩ/square, and an electromagnetic-wave-absorbing film piece (20 cm×20 cm) having an aluminum layer having linear scratches with a crossing angle θs of 30° and surface resistance of 5 kΩ/square. The surface resistance, size, area ratio and the crossing angle θs of linear scratches of each electromagnetic-wave-absorbing film piece are shown in Table 1.

TABLE 1

| Electromagnetic-Wave-Absorbing Film Piece | Surface Resistance (Ω/square) | Size (cm × cm) | Area Ratio (%)[2] | Crossing Angle of Linear Scratches θs (°) |
|---|---|---|---|---|
| 1a[1] | 377 | 32 × 33 | 62 | 60 |
| 1b[1] | 3.4 × 10³ | 20 × 12 | 14 | 60 |
| 1c[1] | 5 × 10³ | 20 × 20 | 24 | 30 |

Note:
[1]The same as the symbols shown in FIG. 1(a).
[2]The total surface area of the electromagnetic-wave-absorbing film pieces 1a-1c are 100%.

Three electromagnetic-wave-absorbing film pieces 1a, 1b, 1c were adhered to a 100-μm-thick PET film with a gap width d of 1 mm, with the aluminum layer having linear scratches on the upper side, and a 16-μm-thick PET film as a protective plastic layer was fused to the aluminum layer to produce the composite electromagnetic-wave-absorbing film (outer size: 53 cm×33 cm) shown in FIGS. 1(*a*)-1(*c*).

Figure 15:
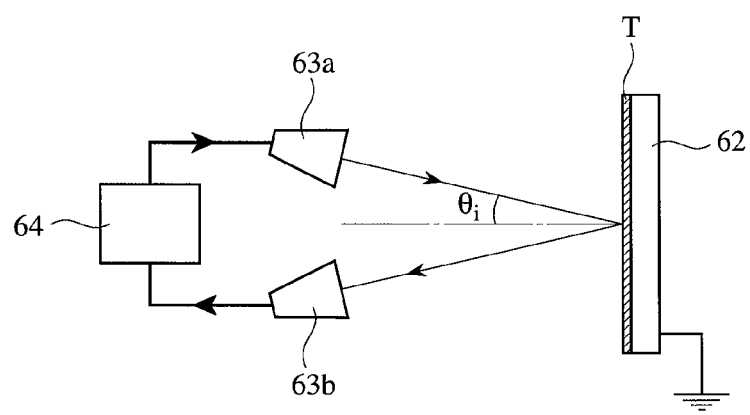
FIG. 15 is a schematic view showing an apparatus for evaluating the electromagnetic wave absorbability of a composite electromagnetic-wave-absorbing film.
Figure 16:
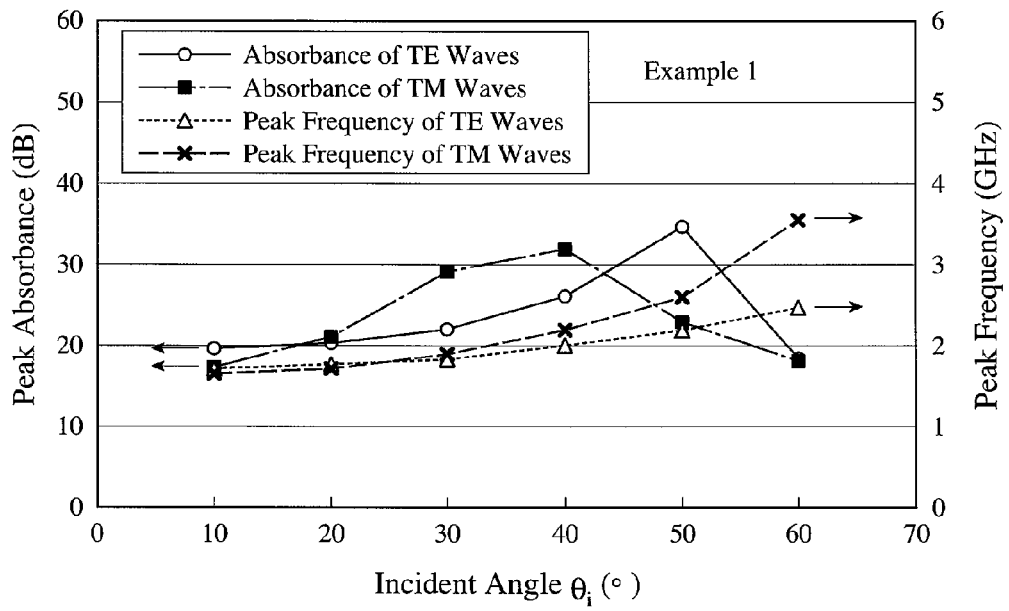
FIG. 16 is a graph showing the relation between the peak absorbance and peak frequency of the composite electromagnetic-wave-absorbing film of Example 1 and an electromagnetic wave incident angle.
Figure 17:
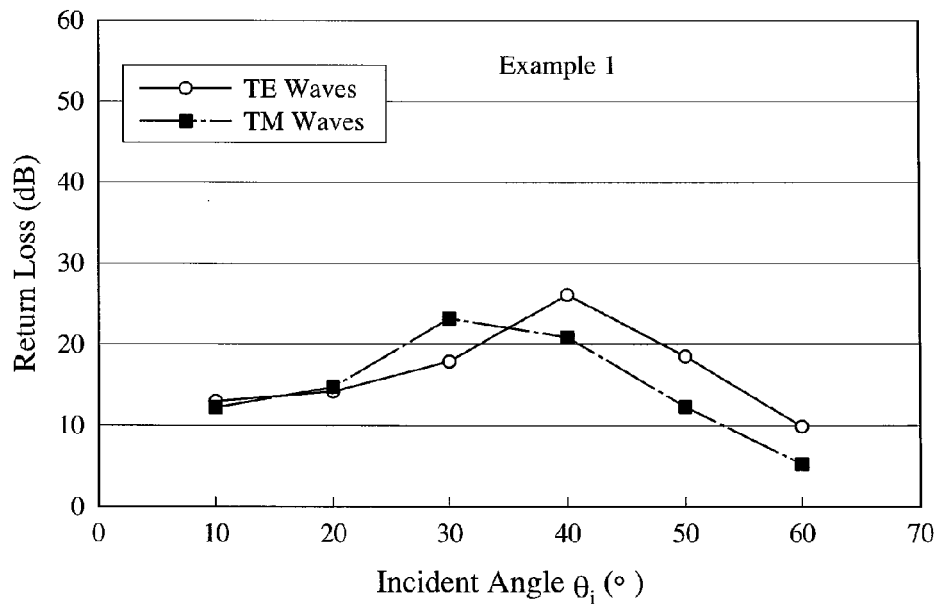
FIG. 17 is a graph showing the relation between the return loss of the composite electromagnetic-wave-absorbing film of Example 1 at a frequency of 2.0196 GHz and an electromagnetic wave incident angle.

Using the apparatus shown in FIG. 15, which comprised a grounded dielectric holder 62, a transmitting antenna 63*a*, a receiving antenna 63*b*, and a network analyzer 64 connected to the antennas 63*a*, 63*b*, the electromagnetic wave absorbability of this composite electromagnetic-wave-absorbing film was evaluated by the following method. First, TE waves and TM waves with frequencies changing from 1 GHz to 6 GHz at intervals of 0.25 GHz and incident angles θi changing from 10° to 60° at intervals of 10° were irradiated from the antenna 63*a* as distant as 100 cm to an aluminum plate (vertical 32 cm×horizontal 52 cm×thickness 2 mm) fixed to the holder 62, and reflected waves were received by the antenna 63*b*, so that reflected electric power was measured by the network analyzer 64. With the aluminum film having linear scratches on the side of the transmitting antenna 63*a*, the composite electromagnetic-wave-absorbing film T was fixed to the holder 62 to measure the reflected electric power in the same manner as above. Assuming that the reflected electric power measured using the aluminum plate was equal to incident electric power, a reflection coefficient (reflected electric power/incident electric power) RC was determined, and return loss RL (dB) was determined by RL (dB)=20 log(1/RC). Because return loss at an incident angle θi changes depending on a frequency, the absorbance of electromagnetic waves at a frequency (peak frequency) at which the return loss was maximum was defined as peak absorbance. With respect to each of TE waves and TM waves, the peak absorbance (dB) and the peak frequency (GHz) were plotted relative to the incident angle θi. The results are shown in FIG. 16. The return loss RL at 2.0196 GHz plotted relative to the incident angle θi is shown in FIG. 17.

EXAMPLE 2

Figure 18:
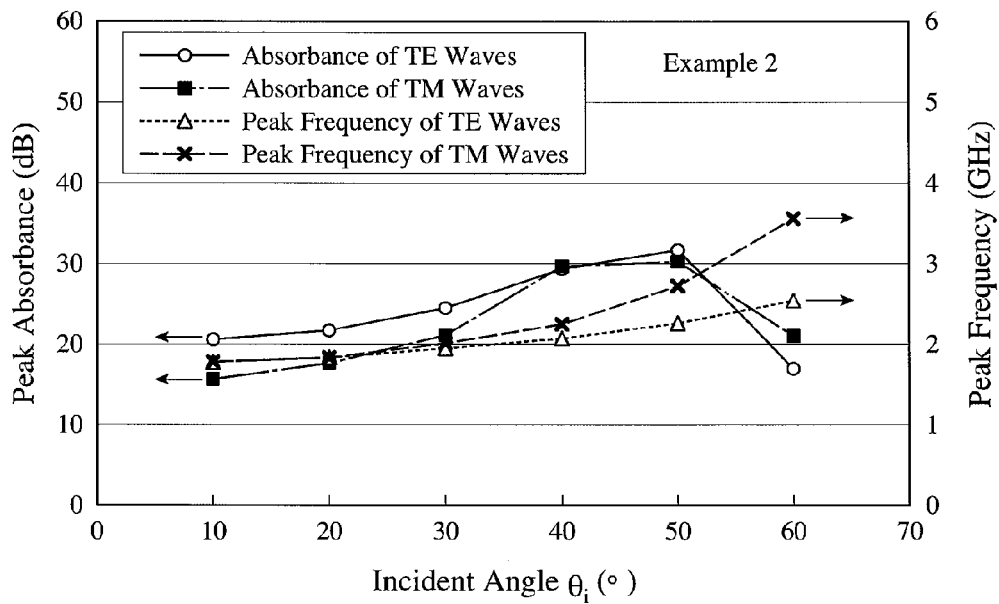
FIG. 18 is a graph showing the relation between the peak absorbance and peak frequency of the composite electromagnetic-wave-absorbing film of Example 2 and an electromagnetic wave incident angle.
Figure 19:
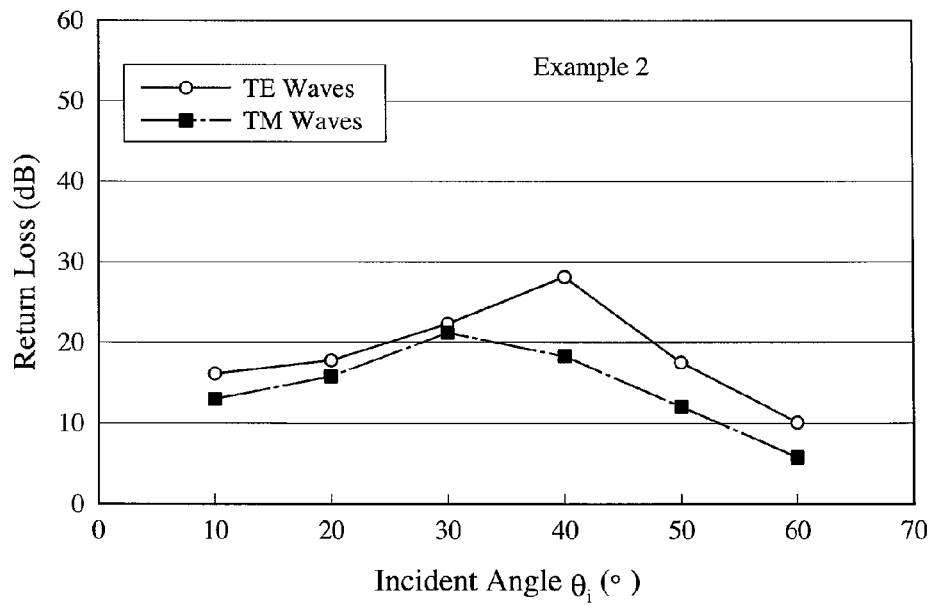
FIG. 19 is a graph showing the relation between the return loss of the composite electromagnetic-wave-absorbing film of Example 2 at a frequency of 2.0196 GHz and an electromagnetic wave incident angle.

Electromagnetic-wave-absorbing film pieces each having the surface resistance, size, area ratio and the crossing angle θs of linear scratches shown in Table 2 were produced, in the same manner as in Example 1 except for changing the operation conditions of the apparatus. As in Example 1, three electromagnetic-wave-absorbing film pieces 1*a*, 1*b*, 1*c* were used to produce a composite electromagnetic-wave-absorbing film, and its electromagnetic wave absorbability was evaluated. The results are shown in FIGS. 18 and 19.

TABLE 2

| Electromagnetic-Wave-Absorbing Film Piece | Surface Resistance (Ω/square) | Size (cm × cm) | Area Ratio (%)[2] | Crossing Angle of Linear Scratches θs (°) |
|---|---|---|---|---|
| 1a[1] | 600 | 32 × 33 | 62 | 60 |
| 1b[1] | 2.7 × 10³ | 20 × 12 | 14 | 60 |
| 1c[1] | 3.5 × 10³ | 20 × 20 | 24 | 60 |

Note:
[1] and [2] are the same as in Table 1.

EXAMPLE 3

Figure 20:
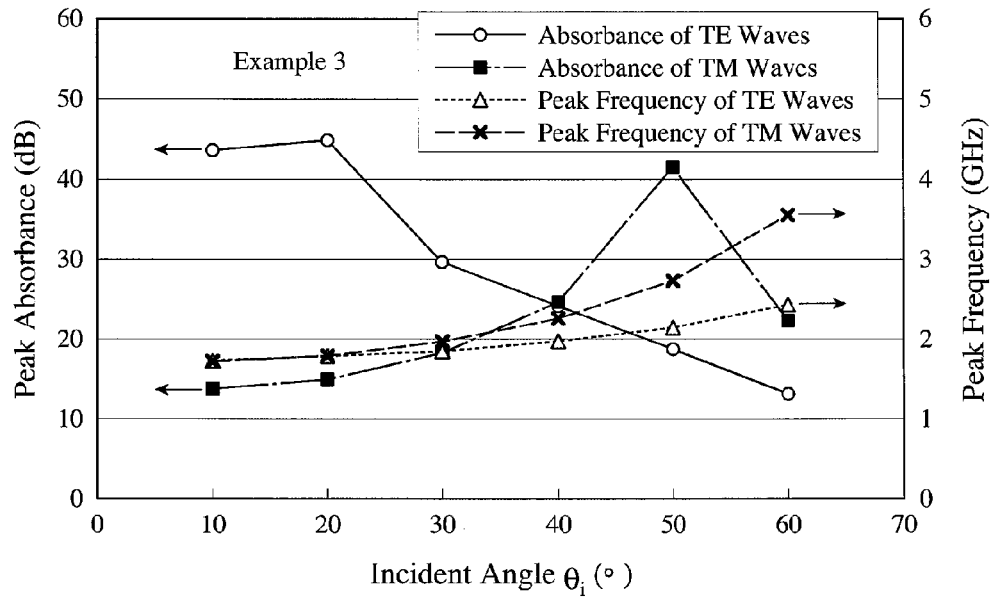
FIG. 20 is a graph showing the relation between the peak absorbance and peak frequency of the composite electromagnetic-wave-absorbing film of Example 3 and an electromagnetic wave incident angle.
Figure 21:
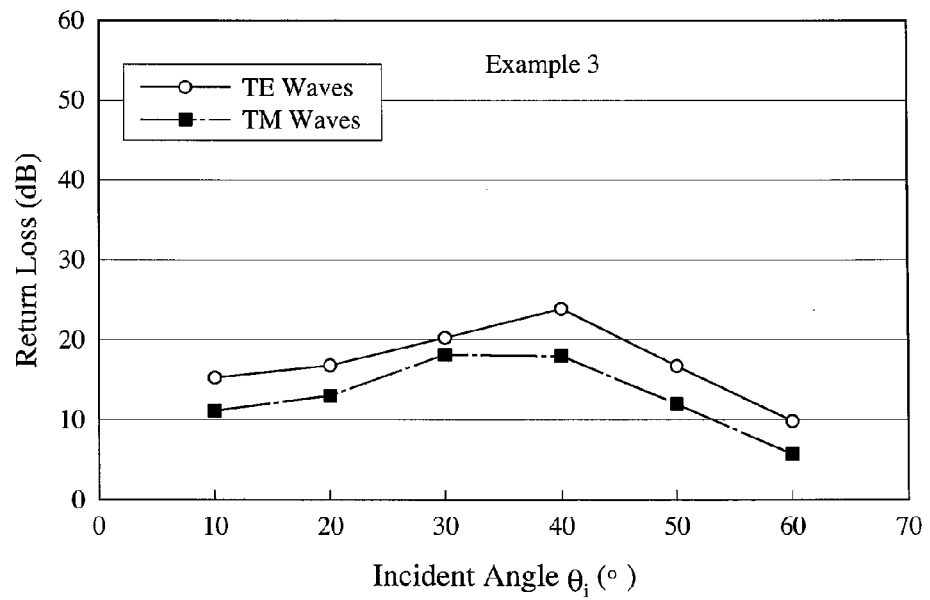
FIG. 21 is a graph showing the relation between the return loss of the composite electromagnetic-wave-absorbing film of Example 3 at a frequency of 2.0196 GHz and an electromagnetic wave incident angle.

Electromagnetic-wave-absorbing film pieces each having the surface resistance, size, area ratio and the crossing angle θs of linear scratches shown in Table 3 were produced, in the same manner as in Example 1 except for changing the operation conditions of the apparatus. As in Example 1, three electromagnetic-wave-absorbing film pieces 1*a*, 1*b*, 1*c* were used to produce a composite electromagnetic-wave-absorbing film, and its electromagnetic wave absorbability was evaluated. The results are shown in FIGS. 20 and 21.

TABLE 3

| Electromagnetic-Wave-Absorbing Film Piece | Surface Resistance (Ω/square) | Size (cm × cm) | Area Ratio (%)[2] | Crossing Angle of Linear Scratches θs (°) |
|---|---|---|---|---|
| 1a[1] | 300 | 32 × 33 | 62 | 90 |
| 1b[1] | 3.4 × 10³ | 20 × 12 | 14 | 60 |
| 1c[1] | 3.5 × 10³ | 20 × 20 | 24 | 60 |

Note:
[1] and [2] are the same as in Table 1.

EXAMPLE 4

Figure 22:
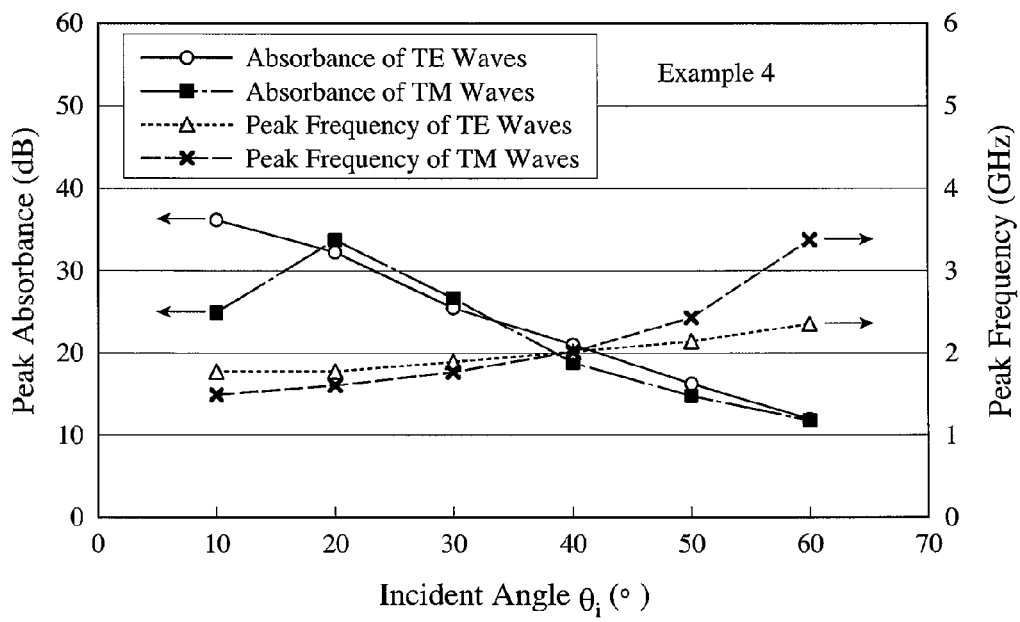
FIG. 22 is a graph showing the relation between the peak absorbance and peak frequency of the composite electromagnetic-wave-absorbing film of Example 4 and an electromagnetic wave incident angle.
Figure 23:
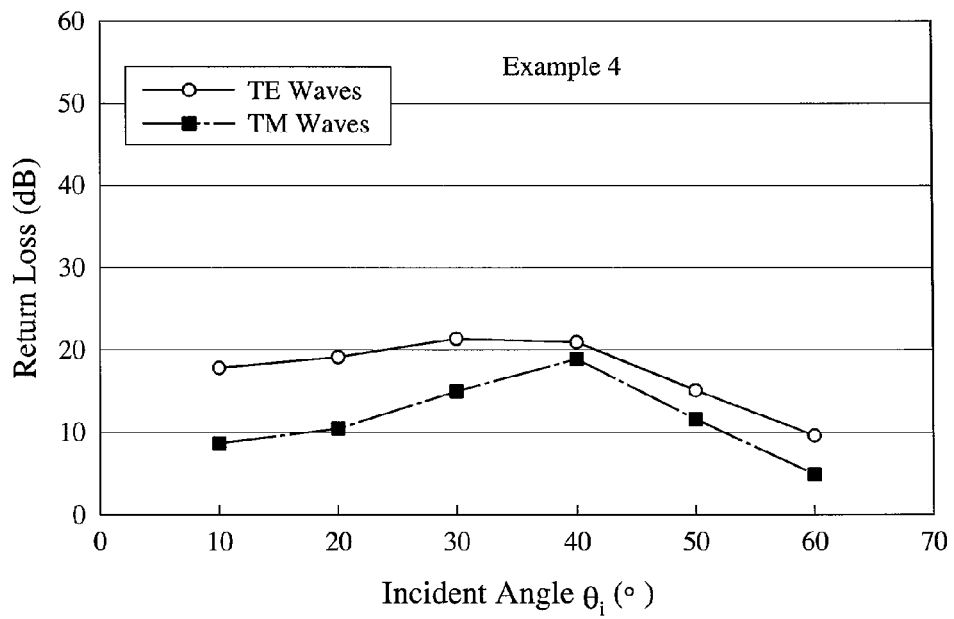
FIG. 23 is a graph showing the relation between the return loss of the composite electromagnetic-wave-absorbing film of Example 4 at a frequency of 2.0196 GHz and an electromagnetic wave incident angle.
Figure 24:
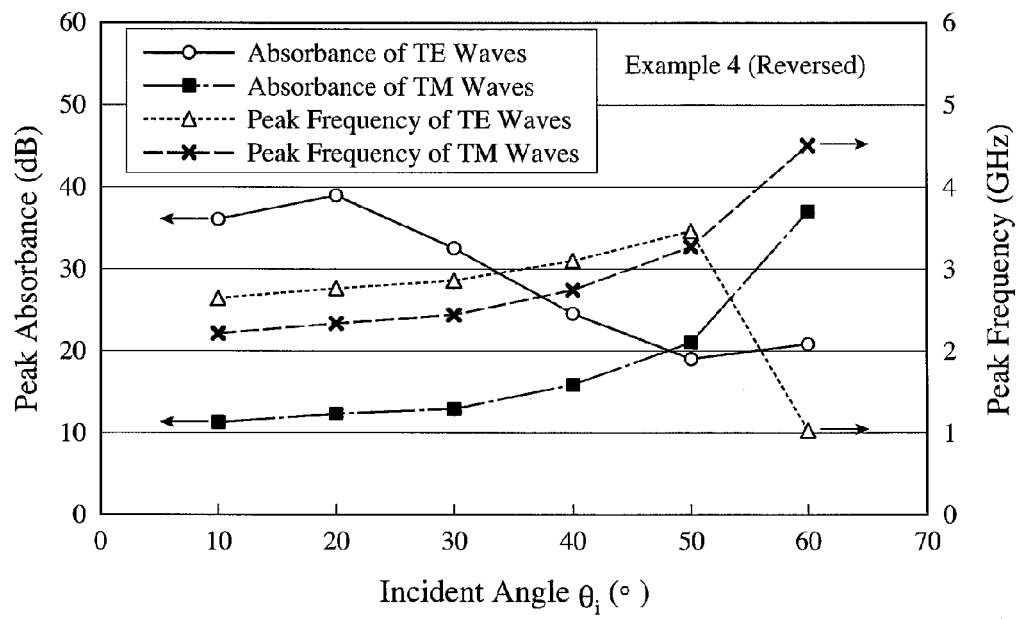
FIG. 24 is another graph showing the relation between the peak absorbance and peak frequency of the composite electromagnetic-wave-absorbing film of Example 4 and an electromagnetic wave incident angle, when the composite electromagnetic-wave-absorbing film is horizontally reversed.
Figure 25:
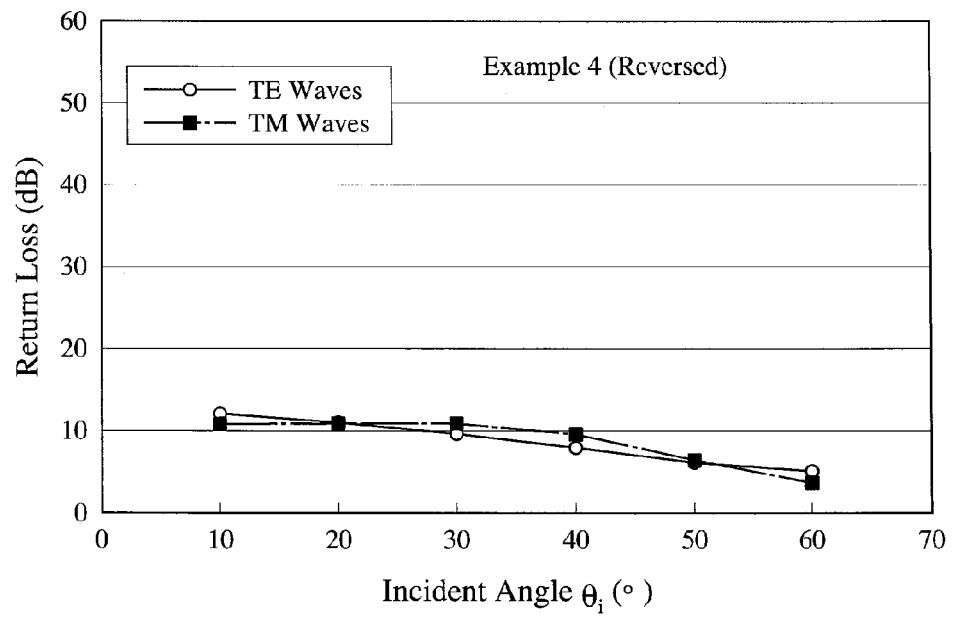
FIG. 25 is another graph showing the relation between the return loss of the composite electromagnetic-wave-absorbing film of Example 4 at a frequency of 2.0196 GHz and an electromagnetic wave incident angle, when the composite electromagnetic-wave-absorbing film is horizontally reversed.

Electromagnetic-wave-absorbing film pieces each having the surface resistance, size, area ratio and the crossing angle θs of linear scratches shown in Table 4 were produced, in the same manner as in Example 1 except for changing the operation conditions of the apparatus. As in Example 1, three electromagnetic-wave-absorbing film pieces 1*a*, 1*b*, 1*c* were used to produce a composite electromagnetic-wave-absorbing film, and its electromagnetic wave absorbability was evaluated. The results are shown in FIGS. 22 and 23. This composite electromagnetic-wave-absorbing film was reversed laterally such that the electromagnetic-wave-absorbing film piece 1*a* was on the side of the receiving antenna 63*b*, and its electromagnetic wave absorbability was evaluated in the same manner as above. The results are shown in FIGS. 24 and 25.

TABLE 4

| Electromagnetic-Wave-Absorbing Film Piece | Surface Resistance (Ω/square) | Size (cm × cm) | Area Ratio (%)[2] | Crossing Angle of Linear Scratches θs (°) |
|---|---|---|---|---|
| 1a[1] | 377 | 32 × 33 | 62 | 60 |
| 1b[1] | 3 × 10³ | 20 × 12 | 14 | 60 |
| 1c[1] | 3.5 × 10³ | 20 × 20 | 24 | 60 |

Note:
[1] and [2] are the same as in Table 1.

REFERENCE EXAMPLE 1

Figure 26:
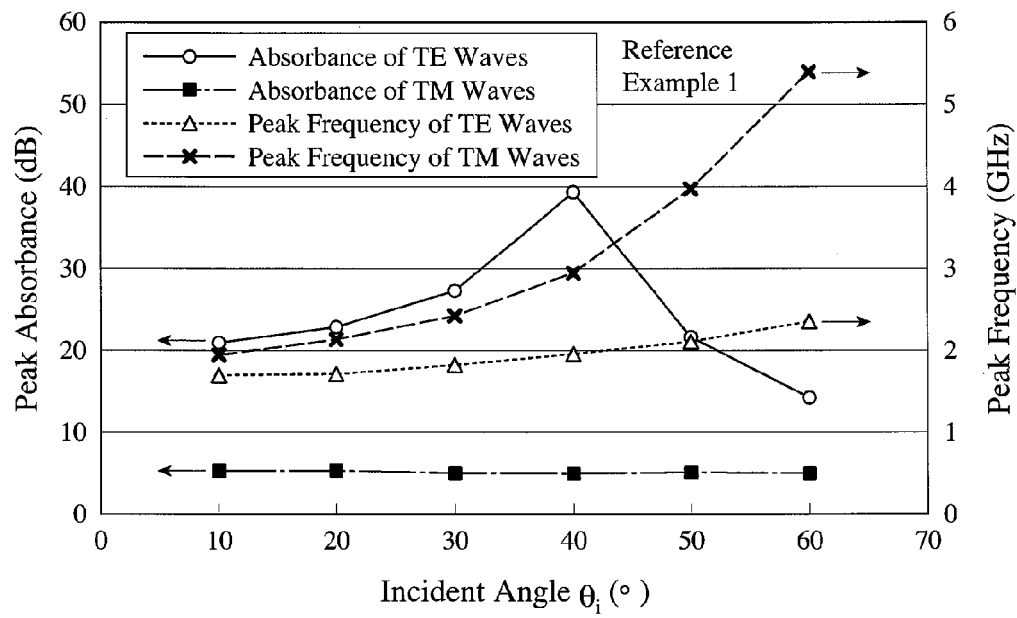
FIG. 26 is a graph showing the relation between the peak absorbance and peak frequency of the electromagnetic-wave-absorbing film piece of Reference Example 1 (when the film piece was fixed to a holder with longer sides vertical) and an electromagnetic wave incident angle.
Figure 27:
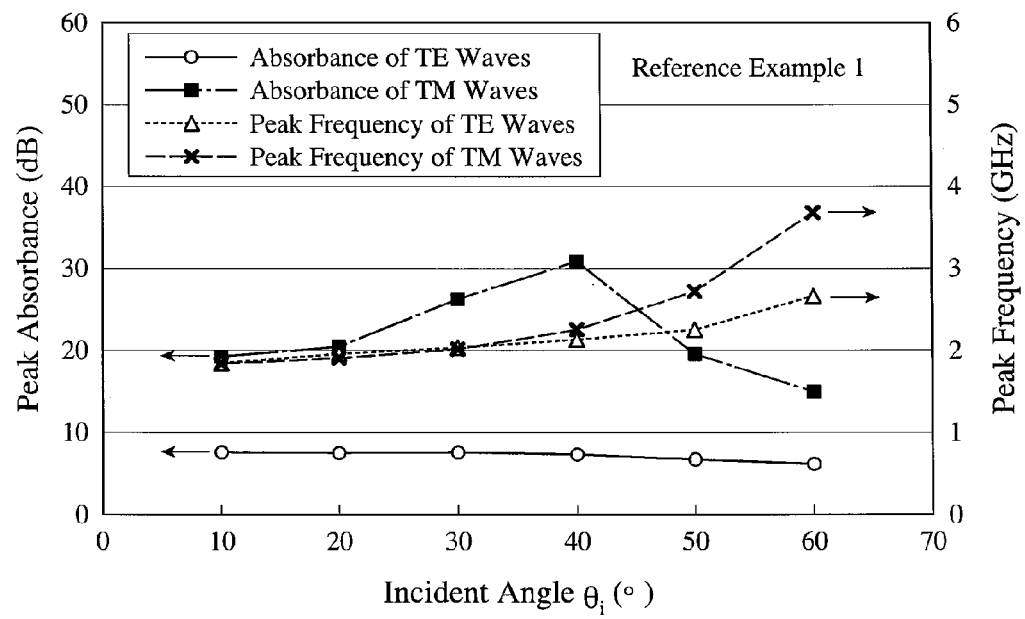
FIG. 27 is another graph showing the relation between the peak absorbance and peak frequency of the electromagnetic-wave-absorbing film piece of Reference Example 1 (when the film piece was fixed to a holder with longer sides horizontal) and an electromagnetic wave incident angle.

An electromagnetic-wave-absorbing film piece having linear scratches with a crossing angle θs of 30°, surface resistance of 377 Ω/square, and a size of 53 cm×33 cm was produced, in the same manner as in Example 1 except for changing the operation conditions of the apparatus. The electromagnetic wave absorbability of this electromagnetic-wave-absorbing film piece was evaluated in the same manner as above. The results are shown in FIG. 26 (when the film piece was fixed to a holder 62 with longer sides vertical) and in FIG. 27 (when the film piece was fixed to a holder 62 with longer sides horizontal).

REFERENCE EXAMPLE 2

Figure 28:
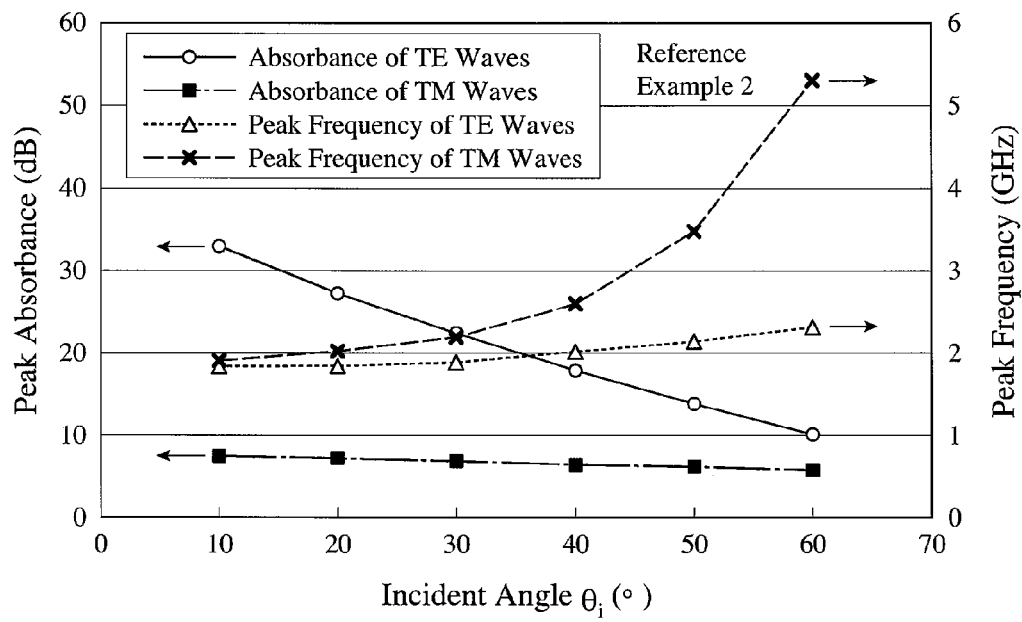
FIG. 28 is a graph showing the relation between the peak absorbance and peak frequency of the electromagnetic-wave-absorbing film piece of Reference Example 2 (when the film piece was fixed to a holder with longer sides vertical) and an electromagnetic wave incident angle.
Figure 29:
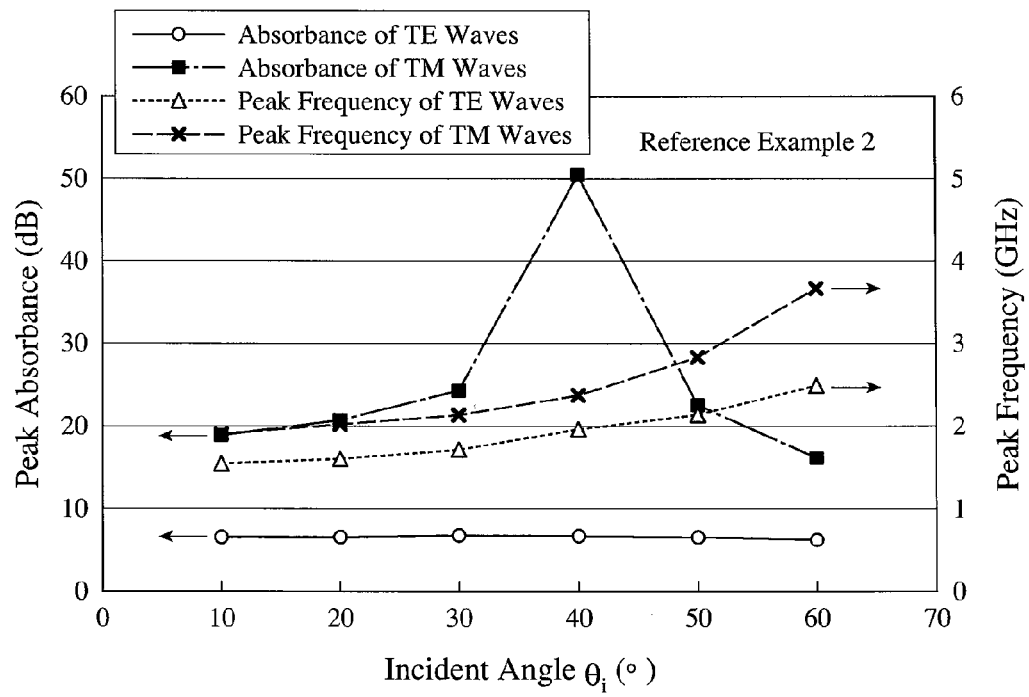
FIG. 29 is another graph showing the relation between the peak absorbance and peak frequency of the electromagnetic-wave-absorbing film piece of Reference Example 2 (when the film piece was fixed to a holder with longer sides horizontal) and an electromagnetic wave incident angle.

An electromagnetic-wave-absorbing film piece having linear scratches with a crossing angle θs of 60°, surface resistance of 377 Ω/square, and a size of 53 cm×33 cm was produced, in the same manner as in Example 1 except for changing the operation conditions of the apparatus. The electromagnetic wave absorbability of this electromagnetic-wave-absorbing film piece was evaluated in the same manner as above. The results are shown in FIG. 28 (when the film piece was fixed to a holder 62 with longer sides vertical) and in FIG. 29 (when the film piece was fixed to a holder 62 with longer sides horizontal).

As is clear from FIGS. 16, 18, 20, 22 and 24, any composite electromagnetic-wave-absorbing films of Examples 1-4 had peak absorbance of 10 dB or more and reaching 30 dB or more to TE waves and TM waves at incident angles θi of 10-60°. As is clear from FIGS. 17, 19, 21, 23 and 25, at a constant frequency (2.0196 GHz), too, any electromagnetic-wave-absorbing films of Examples 1-4 had excellent absorbability to TE waves and TM waves at incident angles θi of 10-60°. On the other hand, in Reference Examples 1 and 2, which did not use combinations of plural electromagnetic-wave-absorbing film pieces with different linear scratches, their absorbability of TE waves and TM waves had larger anisotropy.

EXAMPLE 5

Electromagnetic-wave-absorbing film pieces each having the surface resistance, size, area ratio and the crossing angle θs of linear scratches shown in Table 5 were produced, in the same manner as in Example 1 except for changing the operation conditions of the apparatus. As in Example 1, three electromagnetic-wave-absorbing film pieces 1a, 1b, 1c were used to produce a composite electromagnetic-wave-absorbing film shown in FIG. 6. This composite electromagnetic-wave-absorbing film had electromagnetic wave absorbability with smaller anisotropy.

TABLE 5

| Electromagnetic-Wave-Absorbing Film Piece | Surface Resistance (Ω/square) | Size (cm × cm) | Area Ratio (%)[2] | Crossing Angle of Linear Scratches θs (°) |
|---|---|---|---|---|
| 1a[1] | 300 | 32 × 33 | 62 | 90 |
| 1b[1] | 3.4 × 10³ | 7 × 33 | 14 | 60 |
| 1c[1] | 3.5 × 10³ | 12.5 × 33 | 24 | 60 |

Note:
[1] and [2] are the same as in Table 1.

EXAMPLE 6

Electromagnetic-wave-absorbing film pieces each having the surface resistance, size, area ratio and the crossing angle θs of linear scratches shown in Table 6 were produced, in the same manner as in Example 1 except for changing the operation conditions of the apparatus. As in Example 1, two electromagnetic-wave-absorbing film pieces 1a, 1d were used to produce a composite electromagnetic-wave-absorbing film shown in FIG. 9. This composite electromagnetic-wave-absorbing film had electromagnetic wave absorbability with smaller anisotropy.

TABLE 6

| Electromagnetic-wave-Absorbing film piece | Surface Resistance (Ω/square) | Size (cm × cm) | Area Ratio (%)[2] | Crossing Angle of Linear Scratches θs (°) |
|---|---|---|---|---|
| 1a[1] | 300 | 32 × 33 | 62 | 90 |
| 1d[1] | 3.4 × 10³ | 20 × 33 | 38 | 60 |

Note:
[1] The same as the symbols shown in FIG. 9.
[2] The same as in Table 1.

EFFECTS OF THE INVENTION

Because the composite electromagnetic-wave-absorbing film of the present invention comprises pluralities of adjacent electromagnetic-wave-absorbing film pieces each having a conductor layer having a large number of substantially parallel, intermittent, linear scratches formed with irregular widths and intervals in plural directions, it has good absorbability to electromagnetic waves having various frequencies with little anisotropy. The composite electromagnetic-wave-absorbing film of the present invention having such features is suitably used in electronic appliances and communications apparatuses such as cell phones, personal computers and television sets; RFID (radio frequency identification) systems using IC tags, non-contact IC cards, etc.; wireless LAN systems, electronic toll-collecting systems on toll roads; the prevention of leak and intrusion of electromagnetic wave noises from and through inner walls of buildings, etc.; the prevention of information leak, etc.

What is claimed is:

1. A composite electromagnetic-wave-absorbing film comprising pluralities of adjacent electromagnetic-wave-absorbing film pieces adhered to a plastic base film;
   each electromagnetic-wave-absorbing film piece being a plastic film provided with a conductor layer having a large number of parallel, intermittent, linear scratches formed with irregular widths and intervals;
   said linear scratches having widths in a range of 0.1-100 μm for 90% or more and 1-50 μm on average, and intervals in a range of 0.1-200 μm and 1-100 μm on average;
   said linear scratches in each electromagnetic-wave-absorbing film piece being oriented in at least two directions with crossing angles of 30-90°; and
   pluralities of said adjacent electromagnetic-wave-absorbing film pieces being different from each other in at least one of the widths, intervals, lengths and directions of said linear scratches.

2. The composite electromagnetic-wave-absorbing film according to claim 1, wherein there are small gaps between adjacent electromagnetic-wave-absorbing film pieces.

3. The composite electromagnetic-wave-absorbing film according to claim 1, wherein each conductor layer is a single-layer or multi-layer, thin metal film.

4. The composite electromagnetic-wave-absorbing film according to claim 1, wherein pluralities of said adjacent electromagnetic-wave-absorbing film pieces are different from each other in the directions of said linear scratches.

5. The composite electromagnetic-wave-absorbing film according to claim 1, wherein the conductor layers of pluralities of electromagnetic-wave-absorbing film pieces comprise a first conductor layer having surface resistance of 20 Ω/square to 1 kΩ/square, a second conductor layer having surface resistance of more than 1 kΩ/square and less than 3.5 kΩ/square, and a third conductor layer having surface resistance of 3.5 kΩ/square to 1 MΩ/square.

6. The composite electromagnetic-wave-absorbing film according to claim 5, wherein the area ratios of said first to third conductor layers are 50-70%, 10-20% and 20-30%, respectively, based on their total area (100%).

7. The composite electromagnetic-wave-absorbing film according to claim 5, wherein any of said electromagnetic-wave-absorbing film pieces are rectangular, each of the electromagnetic-wave-absorbing film piece having said second conductor layer and the electromagnetic-wave-absorbing film piece having said third conductor layer being adjacent to one side of the electromagnetic-wave-absorbing film piece having said first conductor layer.

8. A composite electromagnetic-wave-absorbing film comprising pluralities of adjacent electromagnetic-wave-absorbing film pieces adhered to a plastic base film;
   each electromagnetic-wave-absorbing film piece being a plastic film provided with a conductor layer having a large number of parallel, intermittent, linear scratches formed with irregular widths and intervals;
   said linear scratches having widths in a range of 0.1-100 µm for 90% or more and 1-50 µm on average, and intervals in a range of 0.1-200 µm and 1-100 µm on average;
   said linear scratches in each electromagnetic-wave-absorbing film piece being oriented in two directions with crossing angles of only 30-90°; and
   pluralities of said adjacent electromagnetic-wave-absorbing film pieces being different from each other in at least one of the widths, intervals, lengths and directions of said linear scratches.

9. The composite electromagnetic-wave-absorbing film according to claim 8, wherein said scratches are in a finite number of directions.

10. The composite electromagnetic-wave-absorbing film according to claim 8, wherein said linear scratches are in only 2 directions.

11. The composite electromagnetic-wave-absorbing film according to claim 8, wherein said linear scratches are in only 3 directions.

12. The composite electromagnetic-wave-absorbing film according to claim 8, are in only 4 directions.

13. The composite electromagnetic-wave-absorbing film according to claim 8, wherein said scratches are only 45-90°.

14. The composite electromagnetic-wave-absorbing film according to claim 8, wherein said scratches are only 60-90°.

15. A composite electromagnetic-wave-absorbing film comprising pluralities of adjacent electromagnetic-wave-absorbing film pieces adhered to a plastic base film;
   each electromagnetic-wave-absorbing film piece being a plastic film provided with a conductor layer having a large number of intermittent, linear scratches formed with irregular widths and intervals;
   said linear scratches having widths in a range of 0.1-100 µm for 90% or more and 1-50 µm on average, and intervals in a range of 0.1-200 µm and 1-100 µm on average; and
   pluralities of said adjacent electromagnetic-wave-absorbing film pieces being different from each other in at least one of the widths, intervals, lengths and directions of said linear scratches, wherein
   the large number of linear scratches of each said electromagnetic-wave-absorbing film piece comprises at least two groups of the linear scratches comprising a first group and a second group, the linear scratches of the first group are parallel to each other, and the linear scratches of the second group are parallel to each other, and
   a direction of the linear scratches of the first group and a direction of the linear scratches of the second group are oriented in two directions with crossing angles of 30-90°.

* * * * *